US006593178B1

(12) United States Patent
Lee

(10) Patent No.: US 6,593,178 B1
(45) Date of Patent: Jul. 15, 2003

(54) BI-CMOS INTEGRATED CIRCUIT

(75) Inventor: Steven S. Lee, Colorado Springs, CO (US)

(73) Assignee: Hyundai Electronics America, San Jose, CA (US)

( * ) Notice: Subject to any disclaimer, the term of this patent is extended or adjusted under 35 U.S.C. 154(b) by 0 days.

(21) Appl. No.: 08/866,968

(22) Filed: Jun. 2, 1997

Related U.S. Application Data

(63) Continuation of application No. 08/477,056, filed on Jun. 7, 1995, now abandoned, which is a division of application No. 08/378,310, filed on Jan. 25, 1995, now abandoned, which is a continuation of application No. 08/082,694, filed on Jun. 28, 1993, now abandoned, which is a continuation-in-part of application No. 07/987,916, filed on Dec. 7, 1992, now abandoned.

(51) Int. Cl.[7] .......................................... H01L 21/8238
(52) U.S. Cl. ...................................... 438/202; 438/234
(58) Field of Search ................................ 438/202, 203, 438/204, 205, 234, 236, 309, 324

(56) References Cited

U.S. PATENT DOCUMENTS

| 4,800,171 A | | 1/1989 | Iranmanesh et al. |
| 4,818,720 A | | 4/1989 | Iwasaki |
| 4,868,135 A | | 9/1989 | Ogura et al. |
| 4,897,703 A | | 1/1990 | Spratt et al. |
| 4,929,570 A | | 5/1990 | Howell |
| 4,960,726 A | | 10/1990 | Lechaton et al. |
| 4,965,216 A | | 10/1990 | Scovell et al. |
| 5,001,081 A | | 3/1991 | Tuntasood et al. |
| 5,006,476 A | | 4/1991 | De Jong et al. |
| 5,047,357 A | | 9/1991 | Eklund |
| 5,059,549 A | * | 10/1991 | Furuhata |
| 5,082,796 A | * | 1/1992 | El-Diwany et al. |
| 5,100,811 A | * | 3/1992 | Winnerl et al. |
| 5,132,234 A | * | 7/1992 | Kim et al. |
| 5,179,036 A | * | 1/1993 | Matsumoto |
| 5,183,777 A | | 2/1993 | Doki et al. |
| 5,196,356 A | * | 3/1993 | Won et al. |
| 5,516,718 A | * | 5/1996 | Lee |
| 6,249,030 B1 | | 6/2001 | Lee |

OTHER PUBLICATIONS

Silicon Processing for the VLSI Era, vol. 2: Process Integration; Stanley Wolf; 1990; pp. 65.
High–Speed BiCMOS Technology with a Buried Twin Well Structure; Takahide Ikeda et al.; IEEE Transactions on Electron Devcies, vol. Ed–34, No. 6, Jun. 1987; pp. 1304–1310.
BiCMOS Memories: Increasing Speed While Minimizing Process Complexity; Craig Lage; Solid State Technology, Aug. 1992; pp. 31–34.
Process Integration Issues for Submicron BiCMOS Technology; Robert H. Havemann et al.; Solid State Technology Jun. 1992; pp. 71–76.
Perspective on BiCMOS VLSI's; Masaharu Kubo et al.; Journal of Solid–State Circuits, vol. 23, No. 1 Feb. 1988; pp. 5–11.

* cited by examiner

Primary Examiner—Tuan H. Nguyen
(74) Attorney, Agent, or Firm—Townsend and Townsend and Crew LLP

(57) ABSTRACT

The invention concerns a BI-CMOS process, in which Field-Effect Transistors (FETs) and Bipolar Junction Transistors (BJTs) are manufactured on a common substrate. In several processing steps, FET structures are formed simultaneously with BJT structures. For example, in one step, polysilicon gate electrodes for the FETs and polysilicon emitters for the BJTs are formed simultaneously. In another aspect of the invention, a polysilicon layer is used to reduce channeling which would otherwise occur during an implant step.

6 Claims, 23 Drawing Sheets

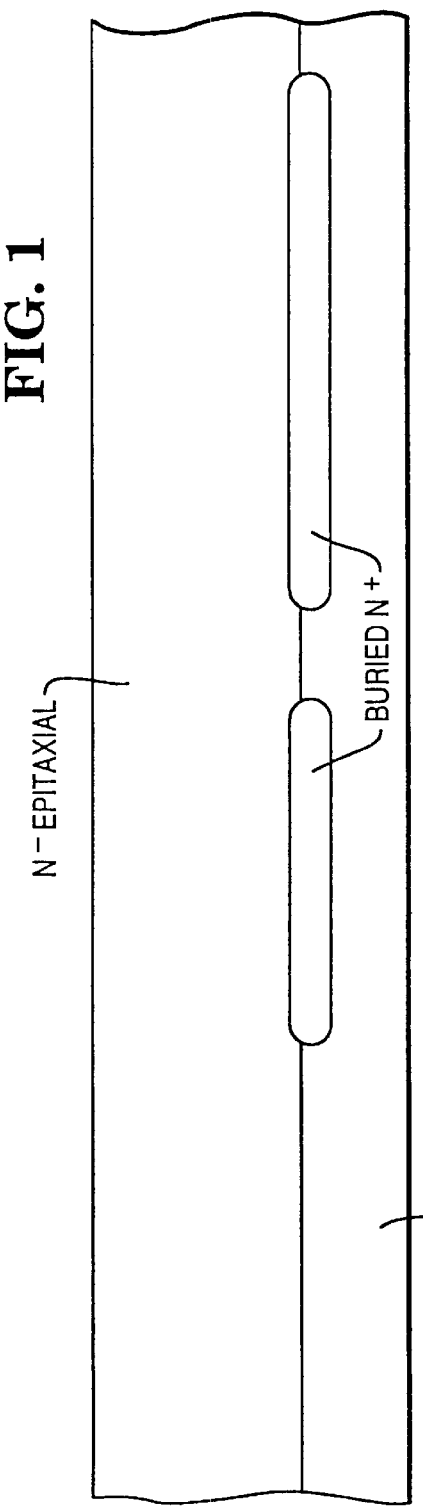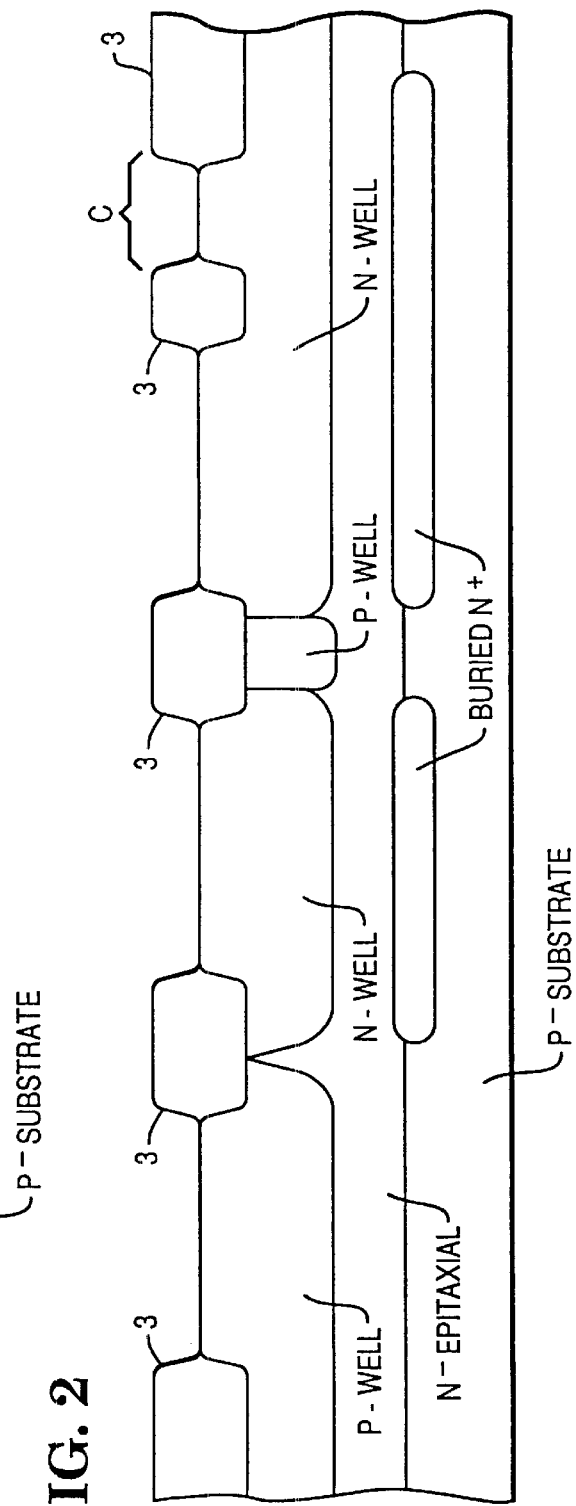

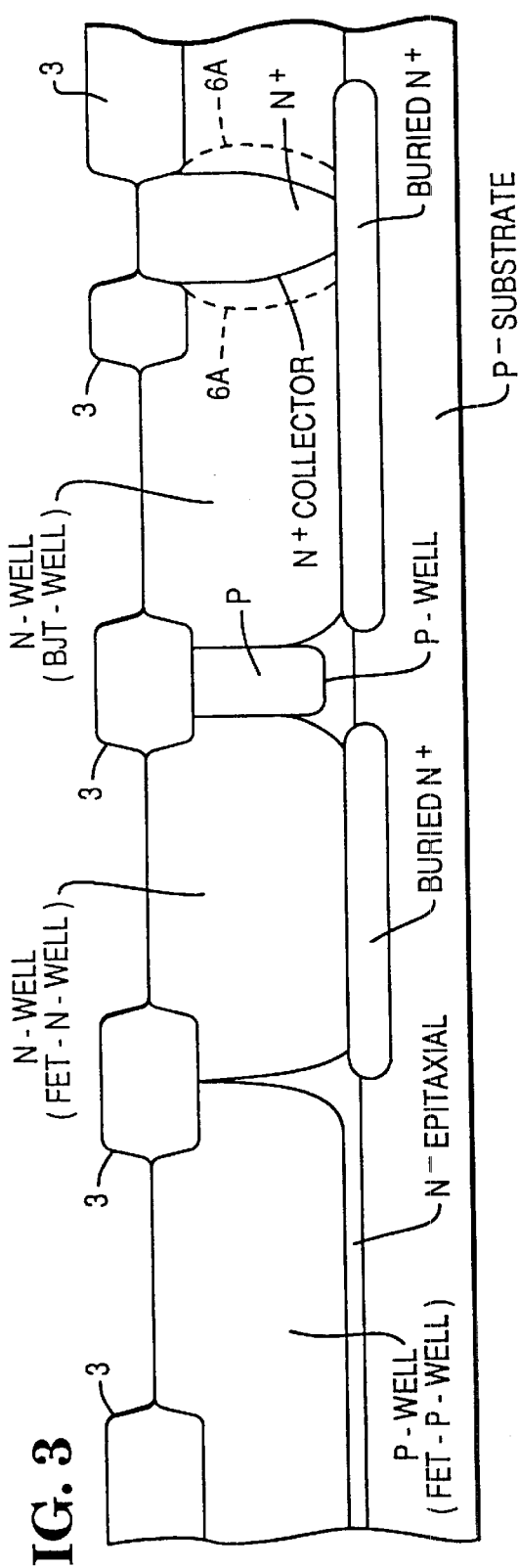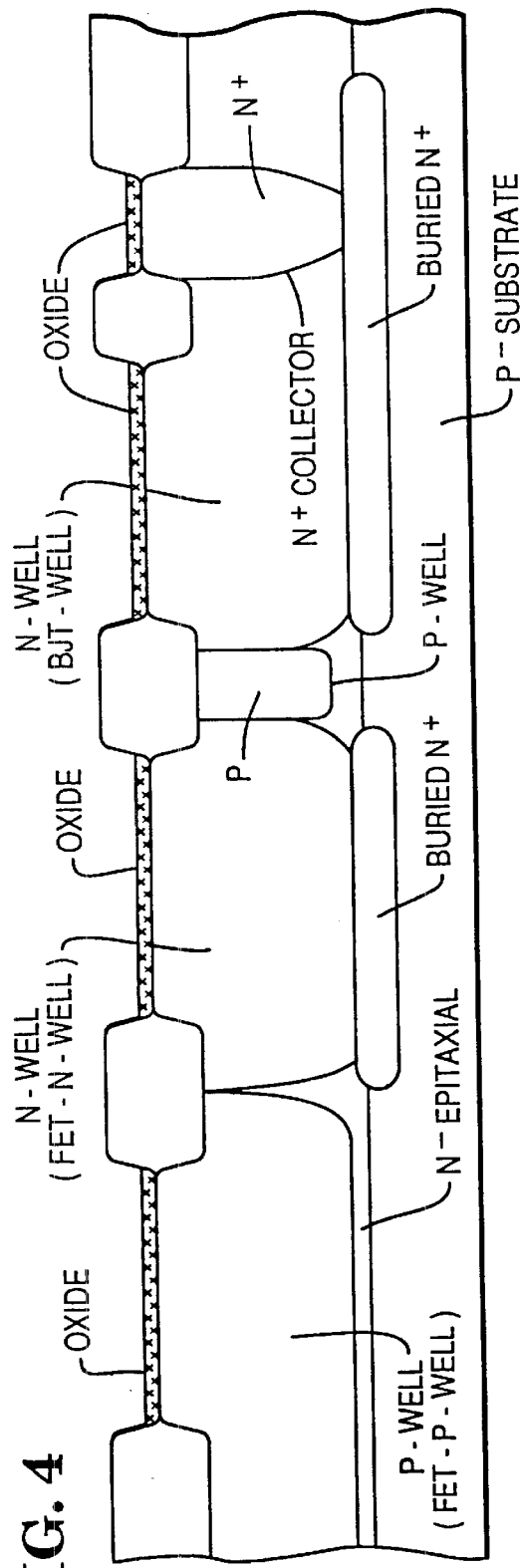

SILICON ATOMS

FIG. 36
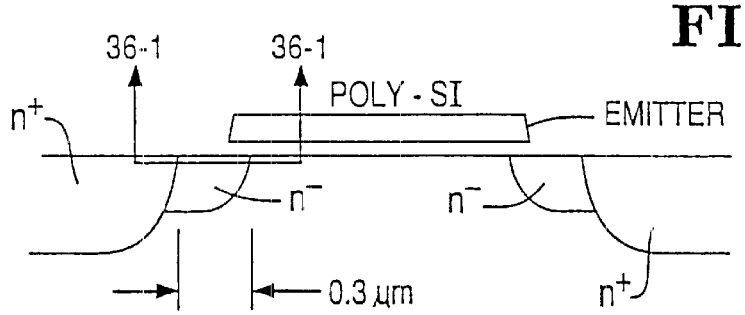
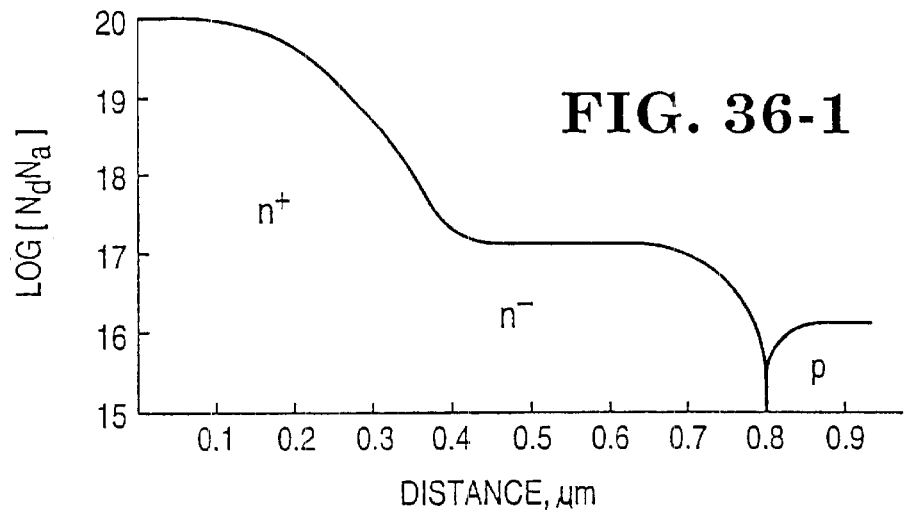
FIG. 36-1
FIG. 37
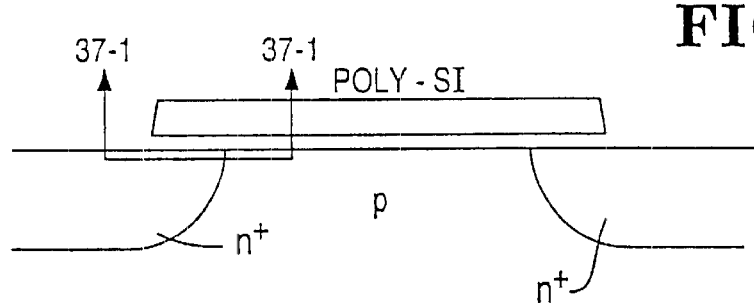
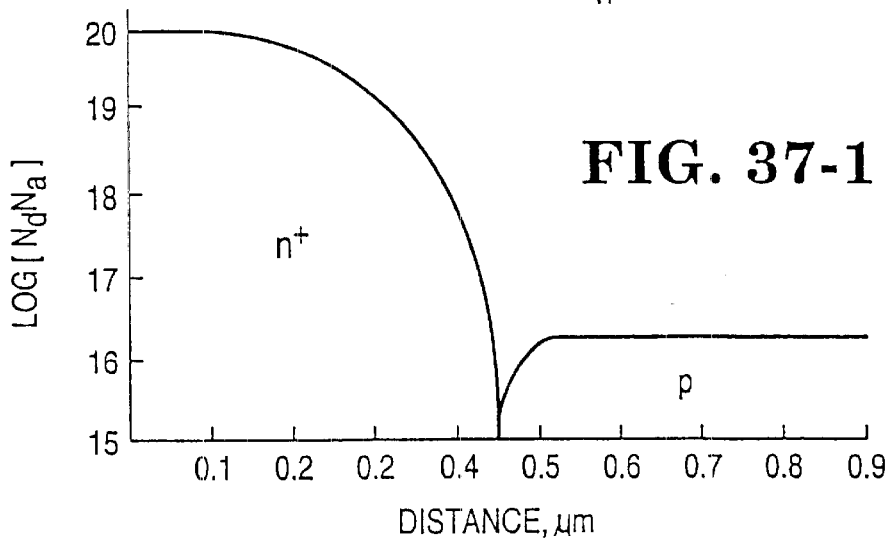
FIG. 37-1

BI-CMOS INTEGRATED CIRCUIT

This is a continuation of application Ser. No. 08/477,056 filed on Jun. 7, 1995, now abandoned which is a divisional of application Ser. No. 08/378,310 filed on Jan. 25, 1995, now abandoned which is a continuation application of Ser. No. 08/082,694 filed on Jun. 28, 1993, now abandoned which is a continuation-in-part application of Ser. No. 07/987,916 filed on Dec. 7, 1992, now abandoned.

The invention concerns a BI-CMOS process for manufacturing integrated circuits. BI-CMOS refers to a single integrated circuit containing the following structures: (a) bipolar junction transistors, (b) N-channel MOSFETs, and (c) P-channel MOSFETs.

BACKGROUND OF THE INVENTION

In general, bipolar junction transistors (BJTs) and field-effect transistors (FETs) are constructed using different fabrication steps. When both BJTs and FETs are to be fabricated on the same integrated circuit (IC), the fabrication process is generally referred to as BI-CMOS. (The term BI-CMOS is sometimes specifically restricted to a particular combination of BJTs and FETs, namely, BJTs and CMOS-type FETs. CMOS is an acronym for Complementary Metal Oxide Semiconductor).

In theory, the fabrication of BI-CMOS devices is straightforward. However, in practice, if one merely adds a BJT sequence of steps to an FET sequence, the resulting sequence contains a large number of total steps, many of which are redundant.

In IC fabrication generally, it is desirable to reduce the total number of processing steps.

OBJECTS OF THE INVENTION

It is an object of the invention to provide an improved sequence of processing steps for integrated circuits.

It is a further object to provide an improved BI-CMOS processing sequence.

SUMMARY OF THE INVENTION

In one form of the invention, a single processing step is used to fabricate structures for both FETs and BJTs in a BICMOS structure. For example, a single layer of polysilicon is used to form both emitters for BJTs and gates for FETs. As another example, a single drive-in step is used to (a) complete drive-in of N- and P-wells for FETs and (b) perform drive-in of a collector plug for a BJT.

BRIEF DESCRIPTION OF THE DRAWINGS

FIGS. 1–7, 14, 15, 17, and 22–28 illustrate a sequence of processing steps which implement one form of the invention.

FIGS. 36 and 36-1 illustrates a Lightly Doped Drain (LDD).

FIGS. 37 and 37-1 illustrates conventional drain doping.

DETAILED DESCRIPTION OF THE INVENTION

FIG. 1—Buried Layers

Figure 5:
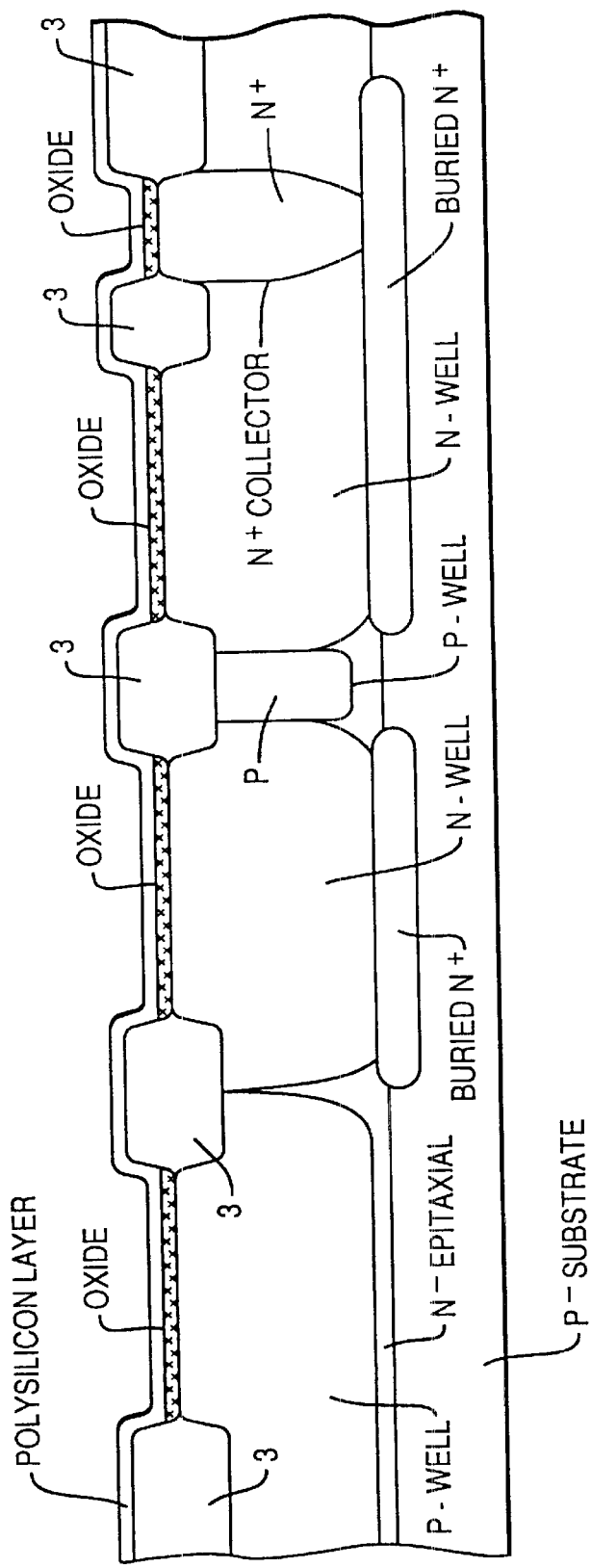

Two $N^+$ layers are formed upon a $P^-$ silicon substrate, as shown in FIG. 1. Then, an epitaxial $N^-$ layer is applied, as shown. The $N^+$ layers become buried layers by virtue of the epitaxial layer.

FIG. 2—Field Oxide & Well Implants

Implants are undertaken to provide dopants which later diffuse (or are "driven in") to form the N+ and P-wells shown in FIG. 2. The implant parameters are the following:

| Implant Species | Energy | Dose |
| --- | --- | --- |
| N-Well | | |
| Phosphorus | 80–150 keV (125 keV typical) | 4 × 10E12–12 × 10E12 (8 × 10E12 typical) |
| P-Well | | |
| Boron | 60–120 keV (70 keV typ.) | 6 × 10E12–15 × 10E12 (1.1 × 10E13 typ.) |

Field oxide regions 3 are then grown, as indicated in FIG. 2. Since the oxide growth is a high-temperature process, the dopants implanted for the P-wells and N-wells begin to diffuse during the oxide growth, forming the precursor wells shown in FIG. 2.

FIG. 3—Collector Plug & Well Drive-In

After the field oxide growth, an implantation in region C in FIG. 2 provides dopant which will, upon drive-in, form the $N^+$ structure 6 in FIG. 3. This $N^+$ structure will eventually form the collector for a BJT (bipolar Junction Transistor). The implant parameters are the following:

| | $N^+$ Collector (Plus) | |
| --- | --- | --- |
| Implant Species | Energy | Dose |
| Phosphorus | 80–300 keV (250 keV typ.) | 0.5 × 10E16–3 × 10E16 (2 × 10E16 typ.) |

After this collector implant, heat treatment drives the two N-wells into contact with the buried layers, as shown in FIG. 3, and completes the drive-in of tie P-well.

At this time, three types of well can be defined:
1. The well containing the BJT, which is termed a BJT-well.
2. The wells containing the FETs, which are termed FET-wells. There are two types:
   2A) The P-well which will later contain an FET will be termed FET-P-well.

2B) The N-well which will later contain an FET will be termed FET-N-well, as labeled in FIG. 4.

The collector structure 6 is sometimes termed a "collector plug." The atoms implanted into region C in FIG. 2 will accordingly be called the "collector plug dopants."

The implanting of the collector plug dopants could have been undertaken prior to growth of the field oxide 3 in FIG. 2. In such a case, the drive-in for (a) the three types of well and (b) the collector could have been undertaken simultaneously. However, in this case, the collector plug 6 would have diffused laterally, and the resulting plug would resemble the dashed plug 6A in FIG. 3.

Dashed plug 6A is wider than plug 6. The excess width is not desirable, because the plug now occupies greater space. Space on an integrated circuit is a valuable commodity.

Therefore, under the invention, the implant for the collector plug 6 is undertaken AFTER field oxide growth, but PRIOR TO full drive-in of the three types of wells. Restated, the heat treatment which grows the field oxide is interrupted for the collector plug implant, and then heat treatment is resumed.

Consequently, the collector plug dopants are allowed to diffuse for a shorter time than the dopants in the three wells. Nevertheless, the collector dopants still reach the buried $N^+$ layers, as do the dopants forming the BJT-well and the FET-N-well. There are three important aspects to this shorter diffusion time.

One. The diffusion constant, D, for the collector plug dopants (implanted into region C) is greater than D for the same dopants in crystalline silicon. One reason is that the previous implantation of the dopants into the BJT-well caused damage to the silicon crystal structure. The damage knocked silicon atoms from their normal lattice sites. Now, the later-implanted collector plug dopants can jump between vacant sites, and thus move faster than if fewer vacant sites were available.

Two. The collector plug dopants are implanted with a greater energy than those for the other three wells: they strike the silicon surface at higher velocity, and dive deeper into the silicon. Lying deeper, they must travel a shorter distance to reach the buried $N^+$ layer. Less diffusion time is required.

Three. If the three types of well were fully driven-in PRIOR TO collector plug implantation, the heat from the drive-in would probably anneal the three wells. Annealing restores silicon atoms to their lattice sites, and would reduce the diffusion coefficient of the collector plug dopants.

FIG. 4—Gate Oxide

Silicon dioxide (labeled OXIDE in FIG. 4) is grown as indicated. This OXIDE layer is about 50–200 Å (ie, Angstroms) thick. This oxide covers the exposed surfaces of the three types of well and the surface of the collector plug.

FIG. 5—Polysilicon Baffle

Then, in FIG. 5, a thin (about 300–1,000 Å) polysilicon layer is grown over the oxide layers and the field oxide 3.

Figure 6:
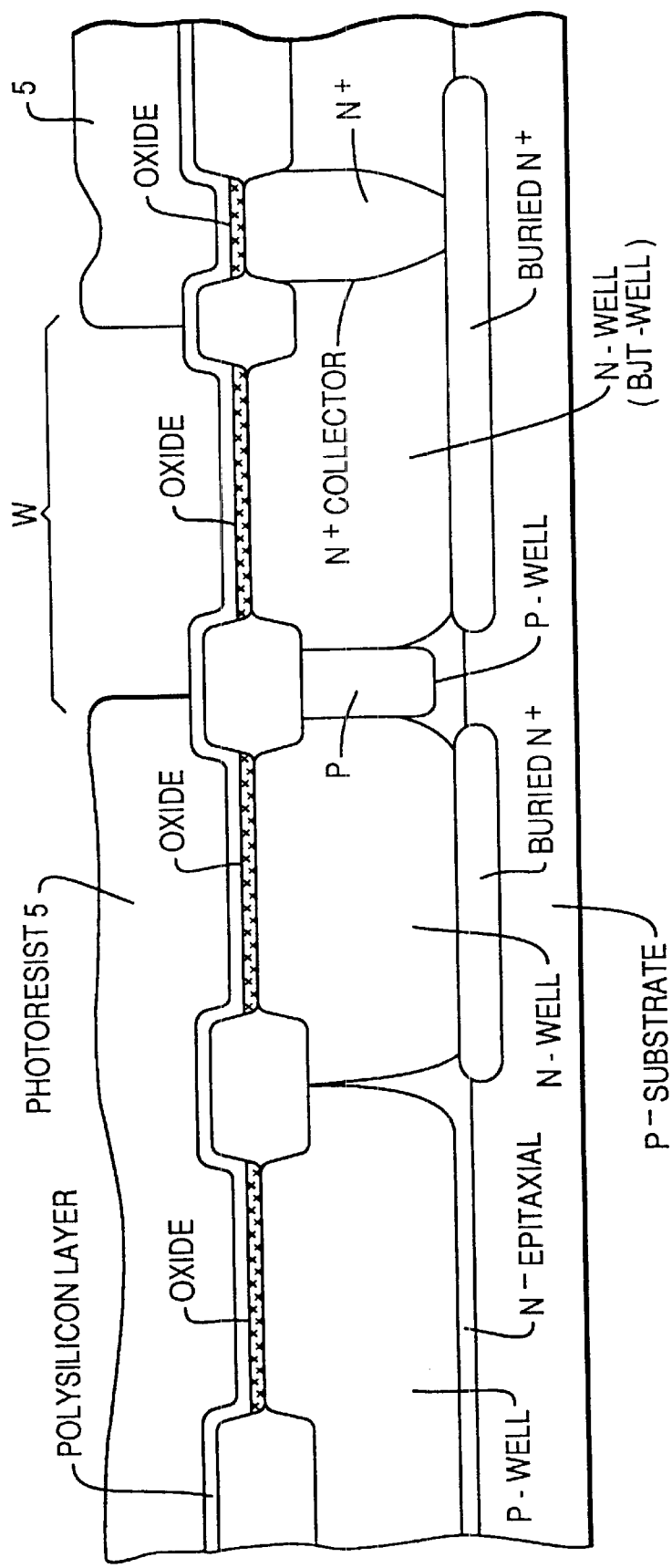
Figure 7:
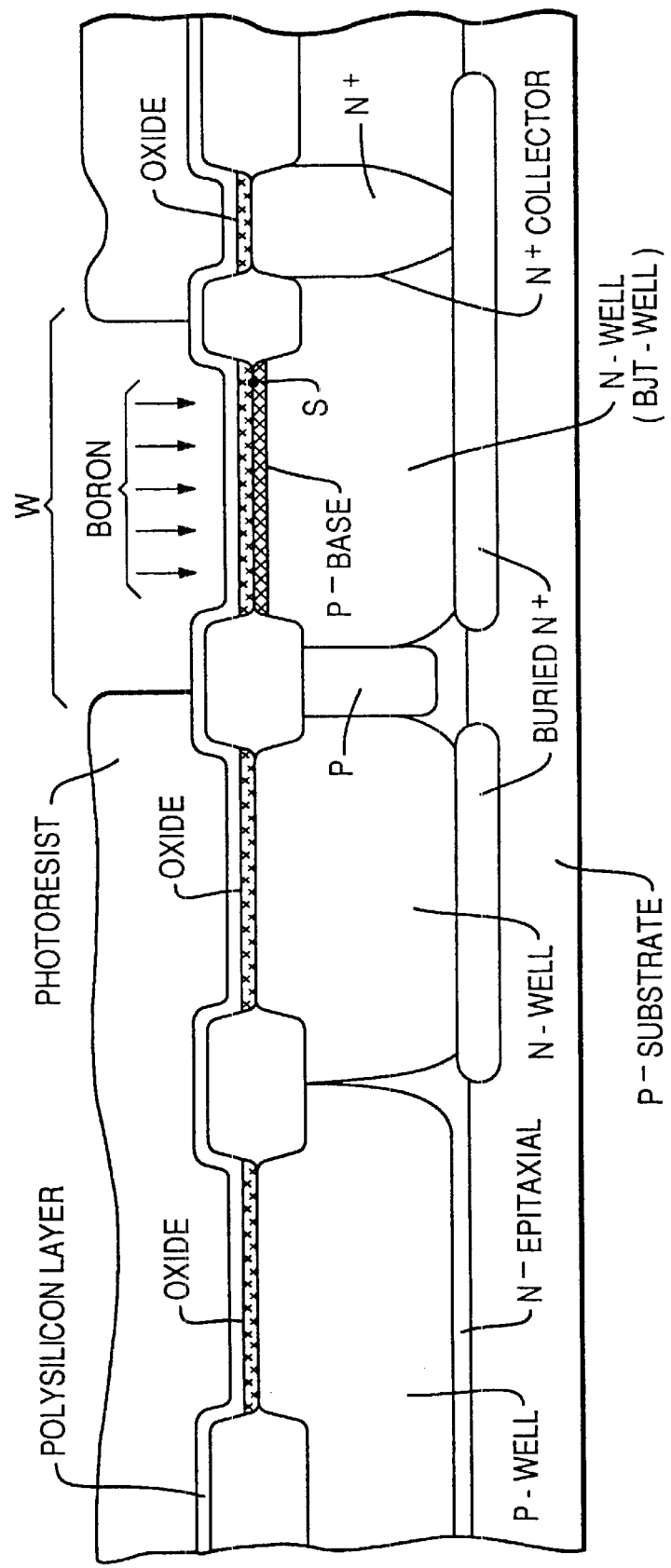

FIGS. 6 and 7—Base Implant for BJT

A masking step creates a photoresist mask 5, as indicated in FIG. 6. A window W in the photoresist exposes the polysilicon located atop the BJT well. A boron implant is undertaken, as indicated in FIG. 7, creating a $P^-$ base layer, as indicated. The boron is implanted through both the oxide layer and the polysilicon film. The polysilicon film has a scattering effect which reduces the channeling effect which may otherwise occur in the implantation.

Channeling effect refers to the "channels" which crystals present to incoming implant atoms. That is, since crystals are constructed of periodic arrays of atoms, there exist parallel planes of atoms which, combined with other parallel planes, define corridors or "channels" for the incoming atoms to follow.

Figure 8:
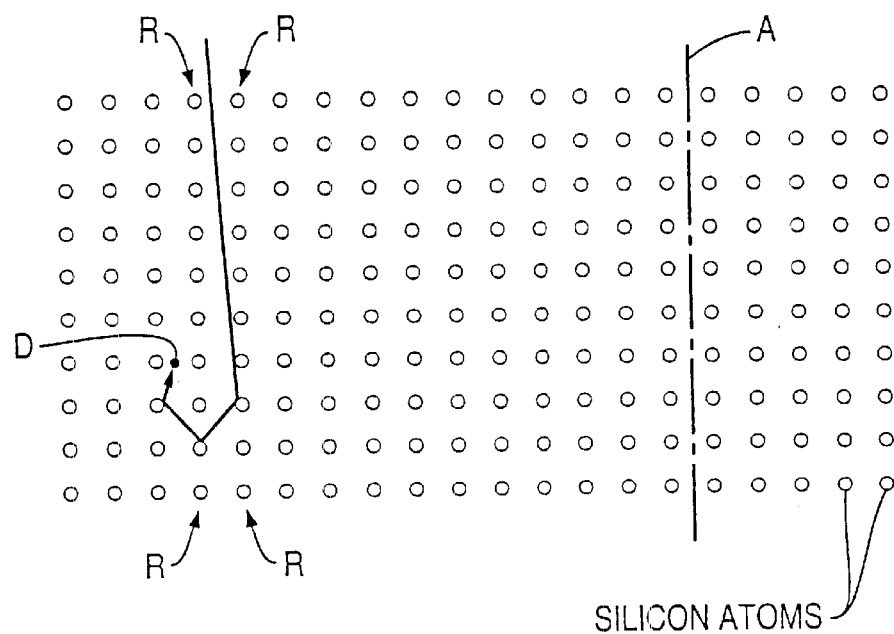
FIGS. 8–11 illustrate channelling, the dopant profile produced by channelling, and how the invention reduces channeling, to improve the profile.
Figure 9:
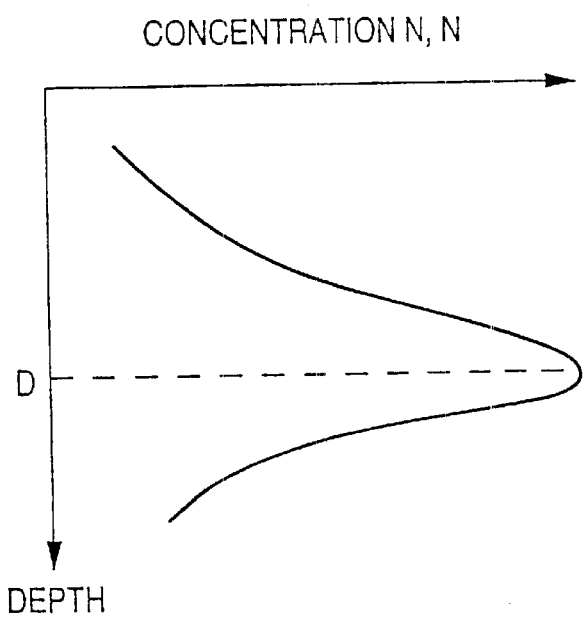

FIGS. 8–9—Channelling

For example, FIG. 8 gives a rough schematic of a simplified channel. FIG. 8 is a simplified rendition of the atoms in crystalline silicon, such as the silicon forming the BJT-well in FIG. 7. An incoming dopant atom D can follow the path indicated by the arrow, and follows a "channel" defined by the two columns of atoms R.

The channeling allows the dopant atom to reach a deeper position than it would if channeling were absent. The plot of FIG. 9 illustrates an exemplary plot of dopant concentration, N, versus depth. Further, with channelling, the depth attained by the atoms is difficult to control.

FIG. 9—Channel Reduction by Polysilicon Baffle

Figure 10:
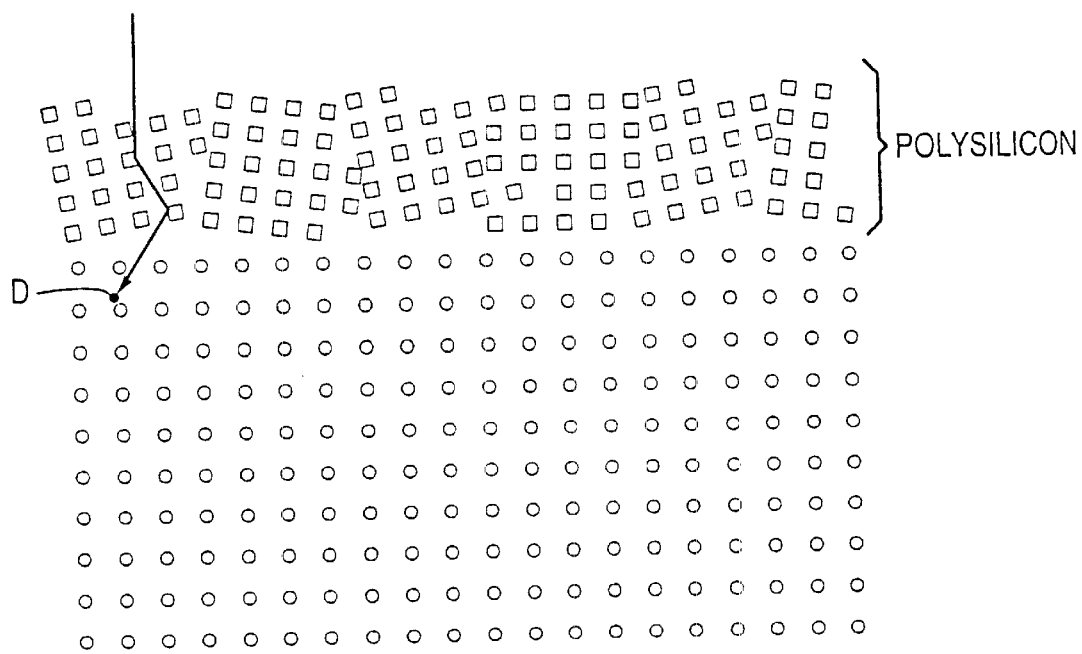
Figure 11:
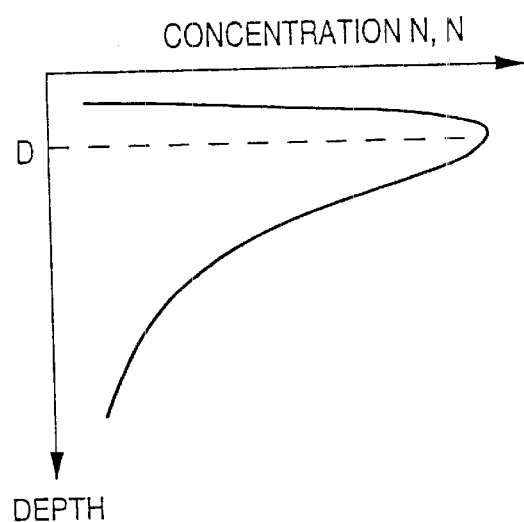

The polysilicon film of FIG. 7 reduces channeling. FIGS. 10–11 illustrates, in rough schematic form, this POLYSILICON film, positioned atop the silicon crystal. The POLYSILICON does not possess the regular crystalline array which the silicon does. Any channels present in the POLYSILICON are short, and randomly oriented. Accordingly, the POLYSILICON blocks the silicon's channels to a large degree. Now, the incoming dopant atom D is scattered by collisions with the POLYSILICON film, and reaches, on average, a lesser depth, as compared with FIG. 8.

The plot of FIG. 11 illustrates an exemplary plot of dopant concentration, N, versus depth, with the polysilicon layer present. Comparison of the two plots in FIGS. 9 and 11 indicates that the mean penetration depth D is reduced by the polysilicon layer.

The oxide layer (first shown in FIG. 4) is not shown in FIG. 10, because the POLYSILICON is believed to be the major contributor to scattering of the incoming dopants, largely because of its amorphous structure and thickness. The oxide layer has a similar amorphous structure, but a smaller thickness, with consequent reduced scattering.

The POLYSILICON film in FIGS. 10 and 7 can be viewed as a baffle, which inhibits axial entry into a channel. That is, even though the dopant D in FIG. 10 may, in fact, enter a channel, the orientation will probably be wrong for significant channeling to occur. For significant channeling to occur, the dopant atom D must enter parallel, or nearly parallel with the axis A shown in FIG. 8. The POLYSILICON baffles such entry, and induces scattering, causing the atom D to enter off-axis.

Figure 12:
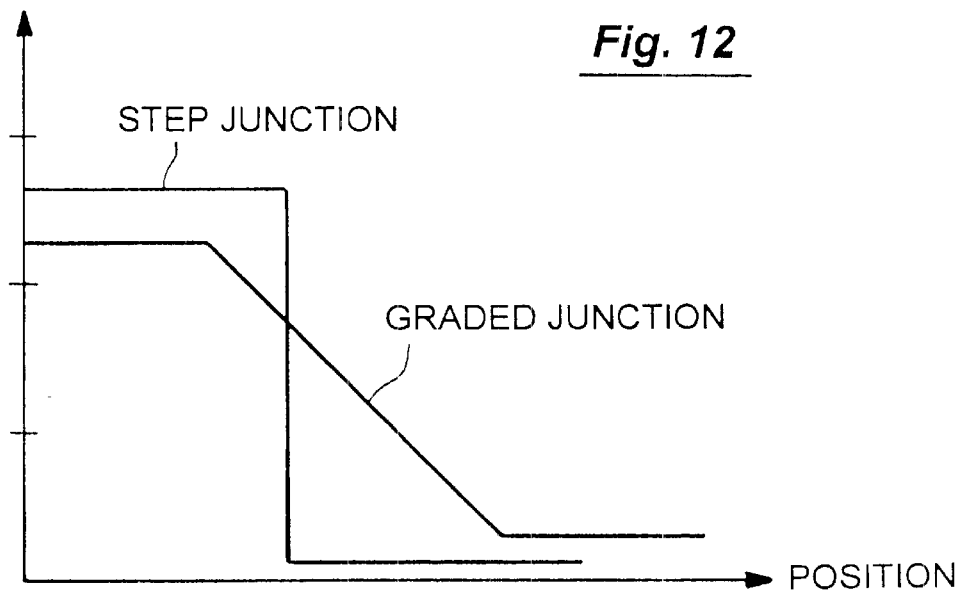
FIG. 12 illustrates a step junction and a graded junction.

The polysilicon scattering layer in FIG. 10 improves breakdown voltage of the P-N junction (ie, the base-emitter junction) which will later be formed at surface S in FIG. 7. The polysilicon scattering layer causes the dopant concentration to approach a step-junction, rather than a graded junction, as a comparison of the profiles in FIGS. 9 and 11 indicates in FIG. 12.

A step junction (or shallow base dopant profile) improves the speed of the transistor. Reliability is improved because the high-field region has been pushed away from the LDD spacer. The region beneath the spacer oxide can contain defects which act as traps for electrons or holes, which degrade the performance of the bipolar transistor.

Base Implant Parameters

One set of implant parameters is the following:

| Implant Species | Energy | Oxide Thickness | Polysilicon Thickness |
|---|---|---|---|
| Boron | 30 KeV | 130Å | 500Å |

Figure 13:
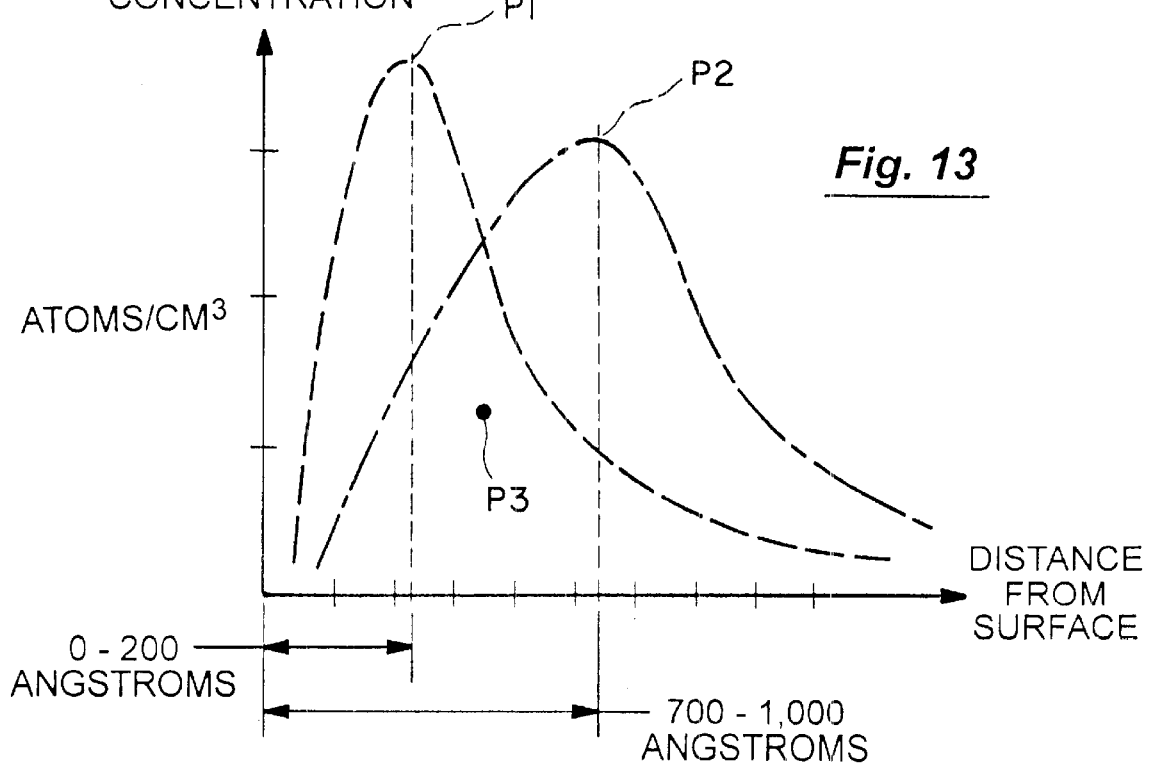
FIG. 13 illustrates the location of the peak of the distribution of an implanted dopant.

Under these conditions, a doping profile between the two profiles shown in FIG. 13 can be expected. One meaning of "between" is that the position of the peak of the profile of the implanted species (not shown) lies between P1 and P2. For example, P3 is "between" P1 and P2.

Figure 14:
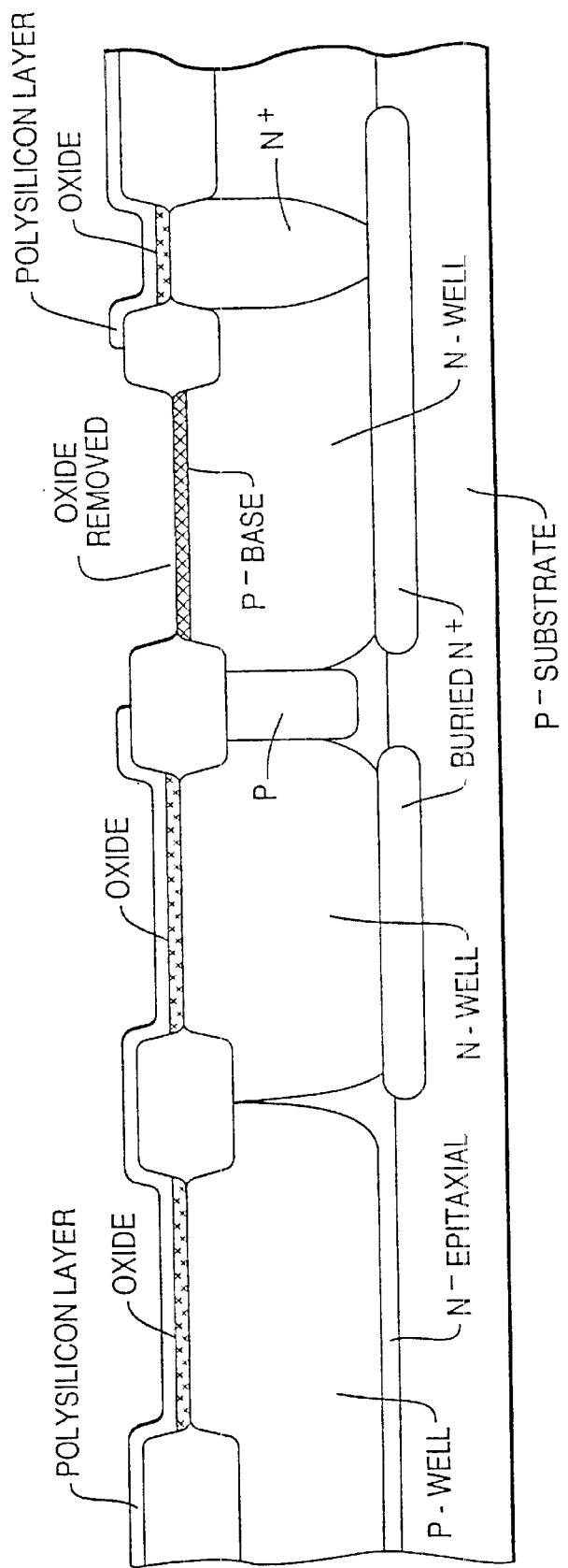

FIG. 14—Removal of Photoresist and Oxide

After the scattered-implant, which creates the P⁻ base layer shown in FIG. 7, the oxide coating of the BJT-well is removed, and then the photoresist is removed, producing the structure shown in FIG. 14. However, the oxide layers covering the FET-wells are left intact, and are not removed.

The photoresist prevents the thin polysilicon located over the FET-wells from being etched away while the oxide over the BJT is removed.

These oxide layers over the FET-wells will form gate oxide for Field Effect Transistors (FETs), in later steps. These oxide regions were not subject to the implant. However, the region of the oxide layer which covered the BJT was subjected to the implant. This implant (shown in FIG. 7) damaged the structure of the oxide. This region of oxide is removed, as indicated in FIG. 14.

Figure 15:
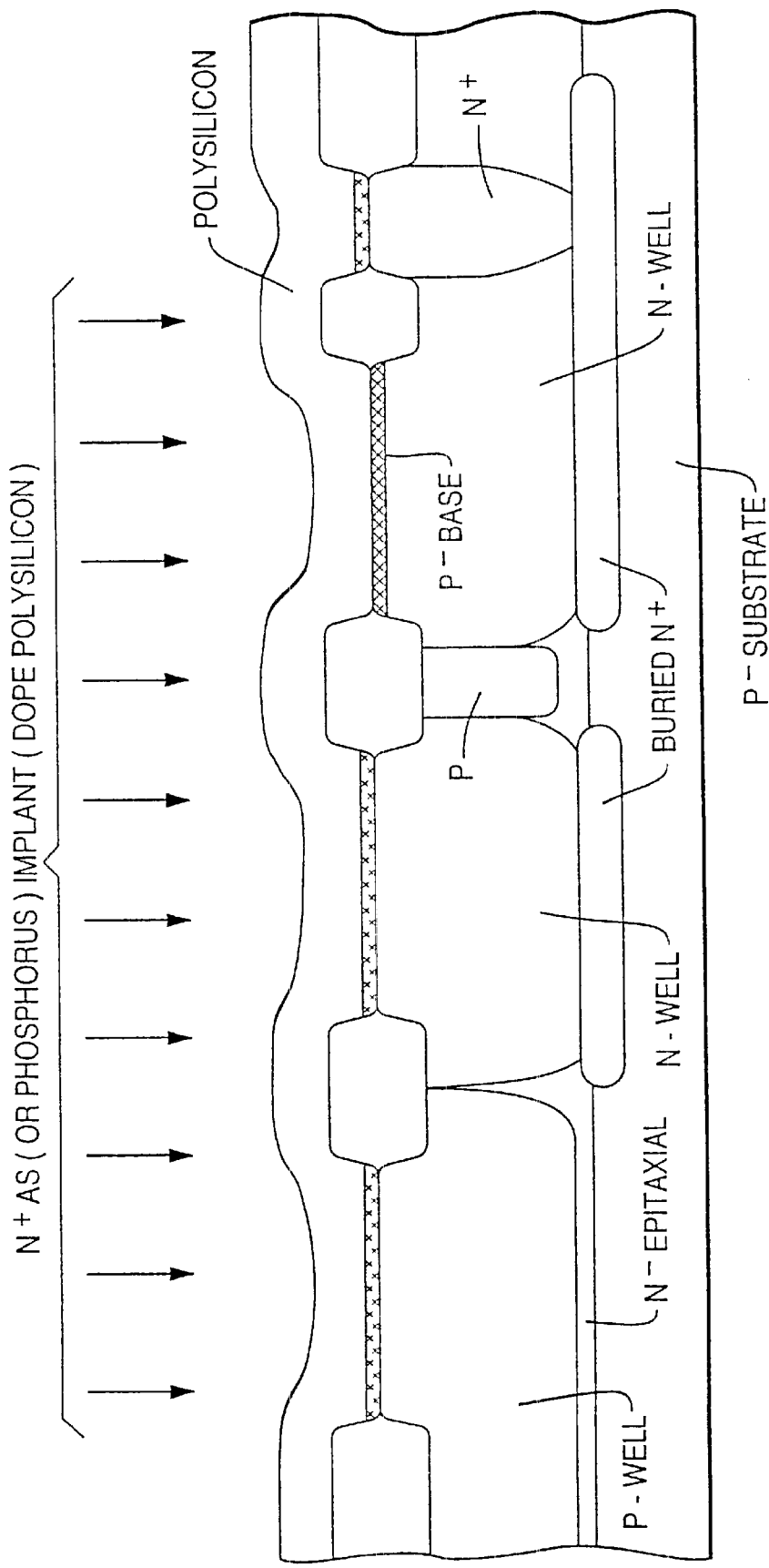
Figure 16:
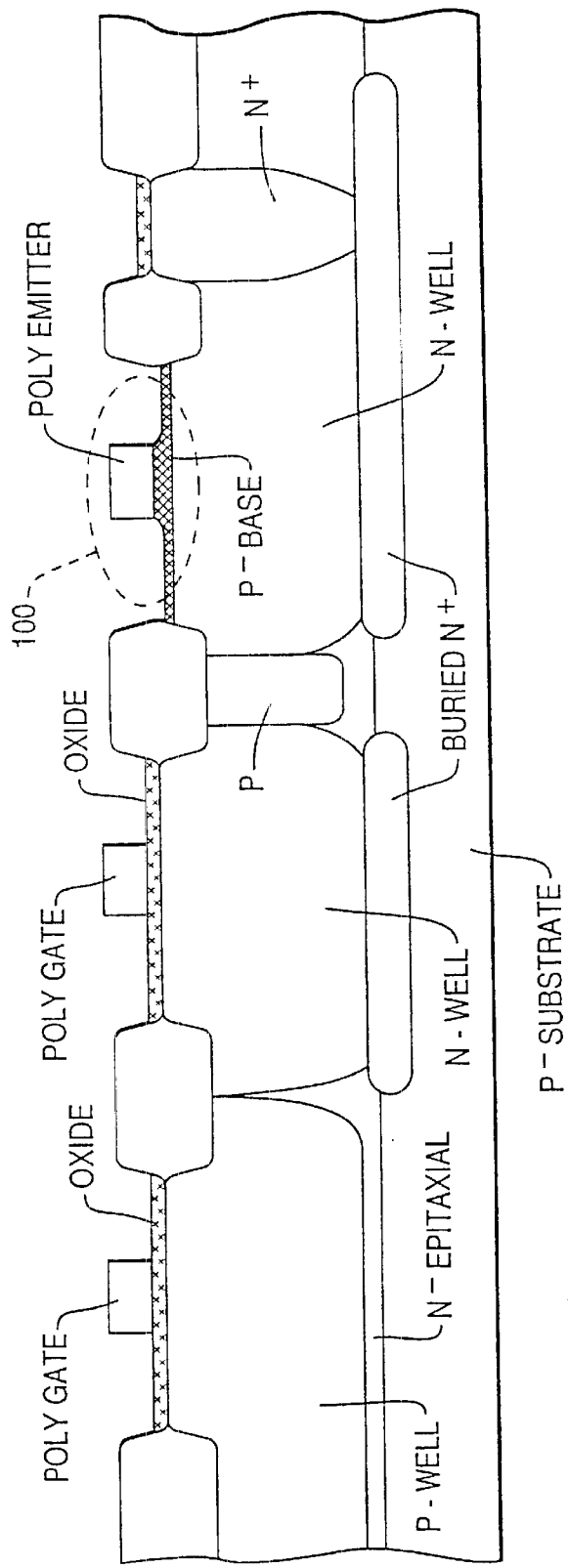
Figure 18:
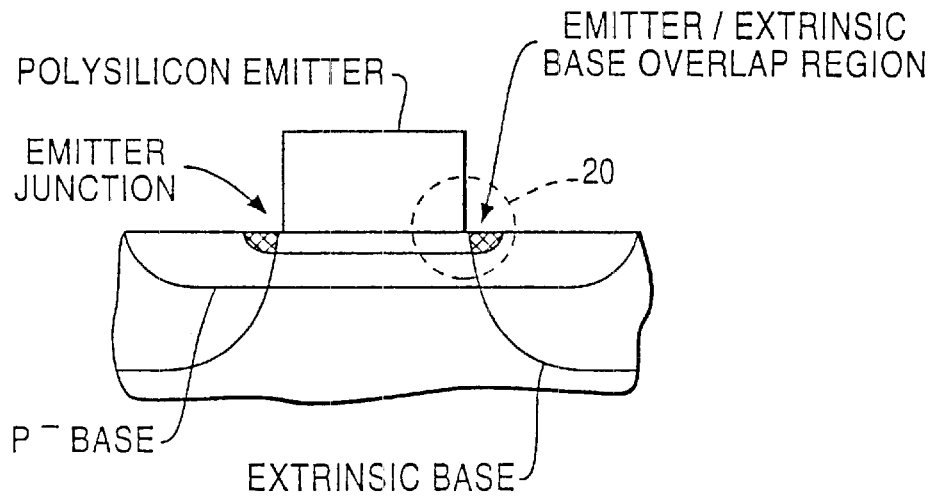
FIGS. 18–21 illustrates how a shallow trenched base improves breakdown voltage, and reduces the overlapping between emitter and base.

FIGS. 15 and 16—Gate and Emitter Formation

Now, a thick POLYSILICON layer is formed, as shown in FIG. 15. This thick POLYSILICON layer is about 1500–4500 Å thick.

This thick POLYSILICON layer adheres to the POLYSILICON film (over the FET-wells) and to the P⁻ base layer (at the surface of the BJT-well). Next, a mask step is undertaken, in which two types of polysilicon structures, shown in FIG. 16, are created.

One type is labeled POLY GATE. This type forms the gate electrodes for FETs. This type is formed upon the OXIDE layers located on the FET-wells. The other type is labeled POLY EMITTER. The POLY EMITTER forms the emitter structure of the BJT. The POLY EMITTER is formed directly upon the P⁻ base: there is no intervening oxide.

Figure 17:
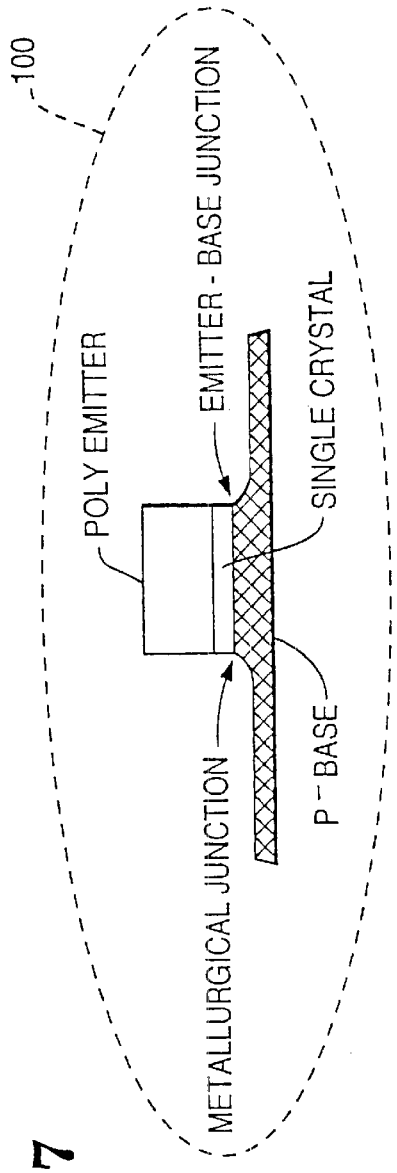

FIGS. 16–17—Trenched Base

An etching step is undertaken, which produces the shallow trenched base shown in FIG. 16 In this etching step, the POLY EMETIC acts as an etch stop. The base-emitter metallurgical junction is indicated in FIG. 17.

The cross-sectional area of this junction is determined by the cross-sectional area of the POLY EMITTER, which is, in turn, determined by the geometry of the mask (not shown) which created the photoresist structure (not shown) which defined the shape of the POLY EMITTER.

Accordingly, the area of the metallurgical, emitter-base junction in FIG. 17 can be accurately controlled. For example, a base-emitter area of 2.25 square microns can be fabricated, plus-or-minus ten percent.

Accurately controlling the base-emitter area is important, because this area partly determined the Gummel number which, in turn, determines the emitter-to-collector current gain. Controlling the area is important in controlling gain.

A significant feature of the shallow trenched base is illustrated in FIGS. 18–21. If no trenched base is created, then the depletion region at the emitter-base junction will look roughly as indicated in the dashed circle 20 in FIG. 19. The sharp corner 21 of the emitter-P⁻ base junction point, creates a high electric field, which causes a lowered breakdown voltage.

That is, leakage current can flow from point G (located in the extrinsic base) to point H (located in the emitter). Points G and H are also shown in FIG. 30.

Figure 19:
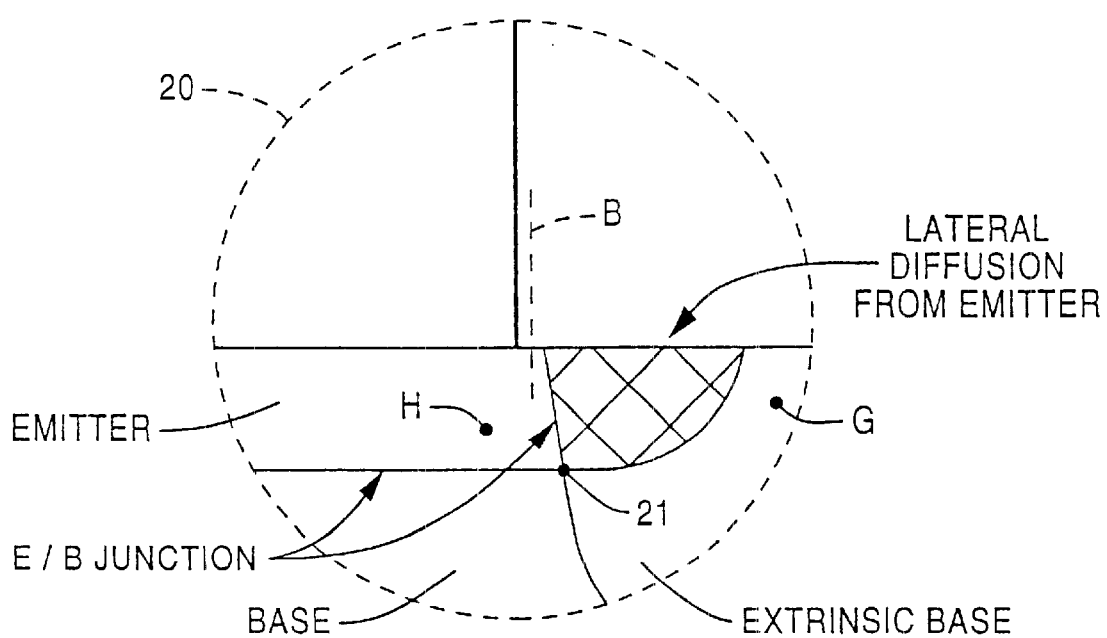
Figure 20:
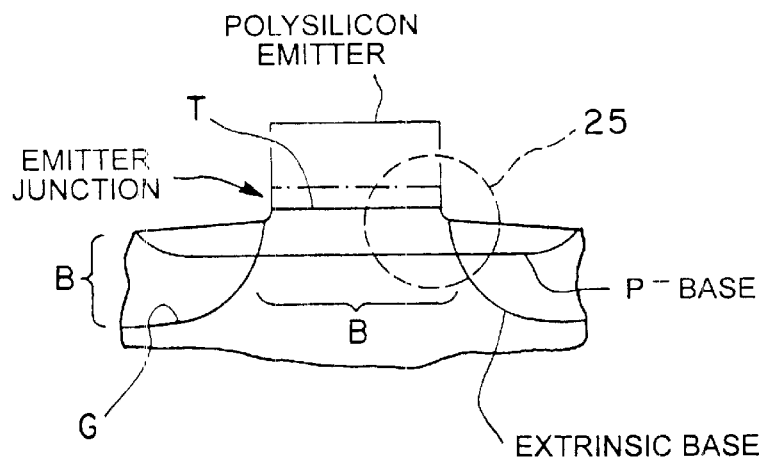
Figure 21:
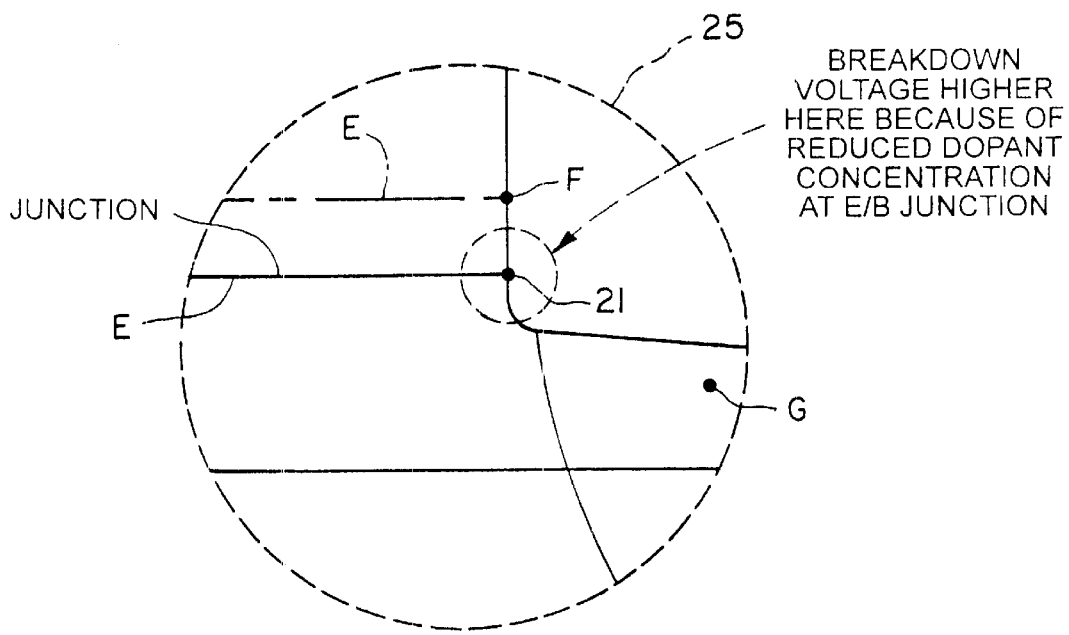

The shallow trench, partially shown in dashed circle 25 in FIG. 21, effectively removes the sharp corner 21 in FIG. 19. That is, after the shallow trench has been constructed, the P-type base material located at the right of imaginary border B in FIG. 19 has been removed. (In FIG. 19, this p-type material still exists.)

Restated, in the completed device, point G in FIG. 21 will lie within an insulator, such as silicon dioxide, rather than in the extrinsic base, as it does in FIG. 19.

Figure 29:
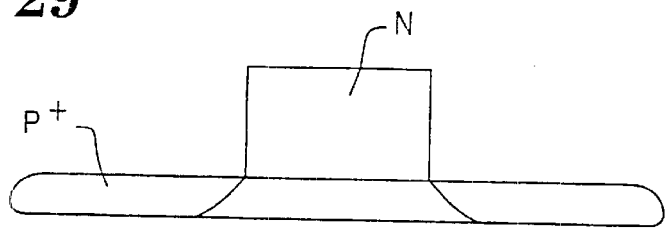
FIGS. 29–32 illustrates how a P-region can diffuse into contact with an N-region.
Figure 30:
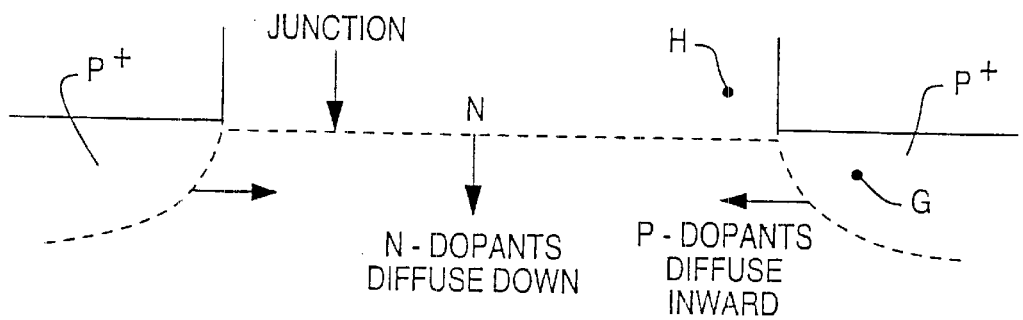
Figure 31:
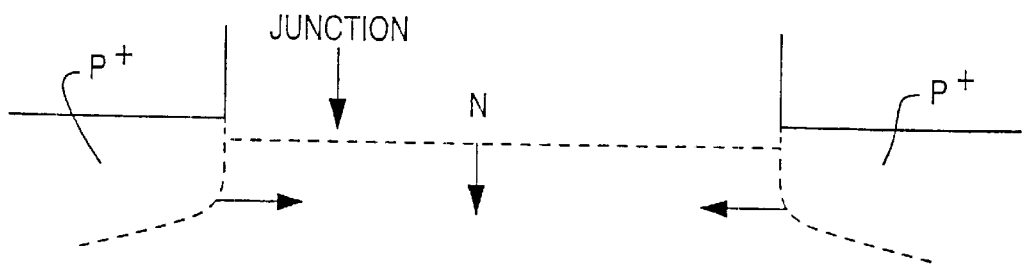
Figure 32:
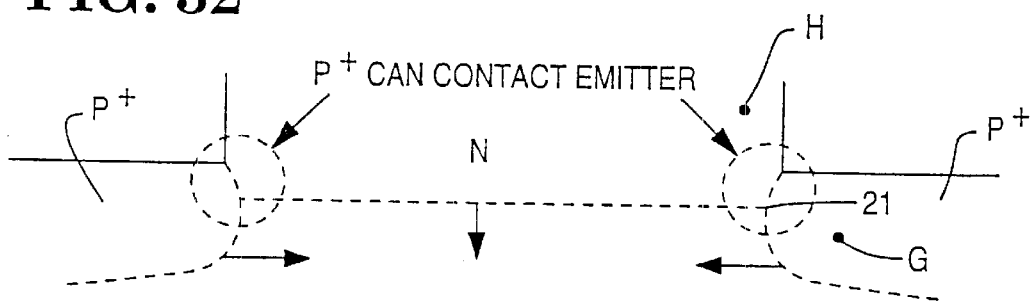

An alternate explanation of the benefits of the trenched base can be given with respect to FIGS. 29–35. FIG. 29 shows the initial base. During subsequent heat treatments, diffusion occurs, causing the N+ and P-regions to diffuse as shown in FIGS. 30–32. As shown in FIG. 32, the P+ region can contact the emitter. High tunnelling currents can occur in the circled regions in FIG. 32.

Figure 33:
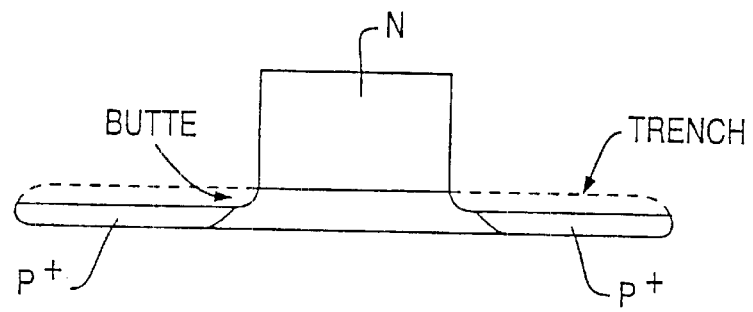
FIGS. 33–35 illustrates how trenching a base can eliminate the problem of FIG. 19.
Figure 34:
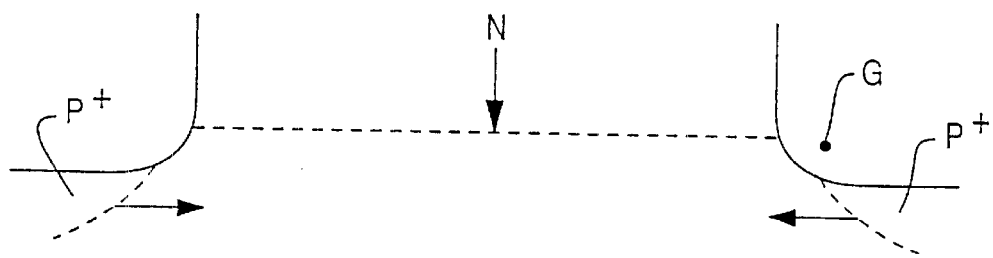
Figure 35:
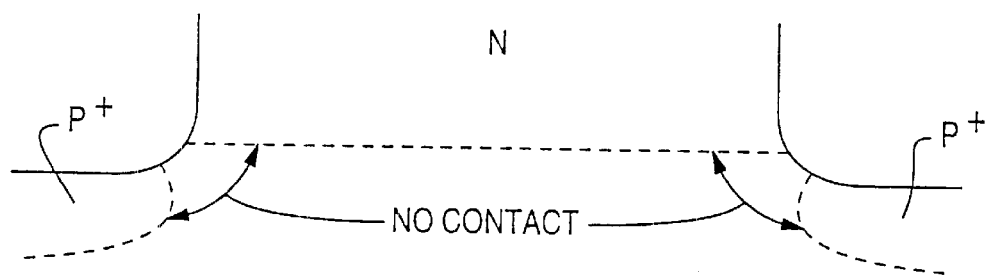

Trenching the base, as shown in FIGS. 33–35, prevents this contact.

The emitter in FIG. 16 can be called butte-mounted (or mesa-mounted), because the eroded part, which form the trench, leaves a structure which resembles a butte B (or mesa) in FIG. 21. The butte is located at the intersection of the two bracketed regions B. The butte is so-called because of its resemblance to the geological structure of the same name.

In order to reduce emitter resistance, a polycide layer, of thickness between 30 and 200 nanometers, can be deposited on the polysilicon. A suitable polycide is tungsten silane, $WSi_2$.

FIG. 36—Lightly Doped Drain (LDD)

After forming the shallow trenched base, a procedure known as LDD (Lightly Doped Drain) is undertaken. This procedure, together with a subsequent, heavier implant, produces the doping profiles shown in 36-1. FIG. 37-1 shows the doping profiles which would occur without the LDD procedure.

Figure 38:
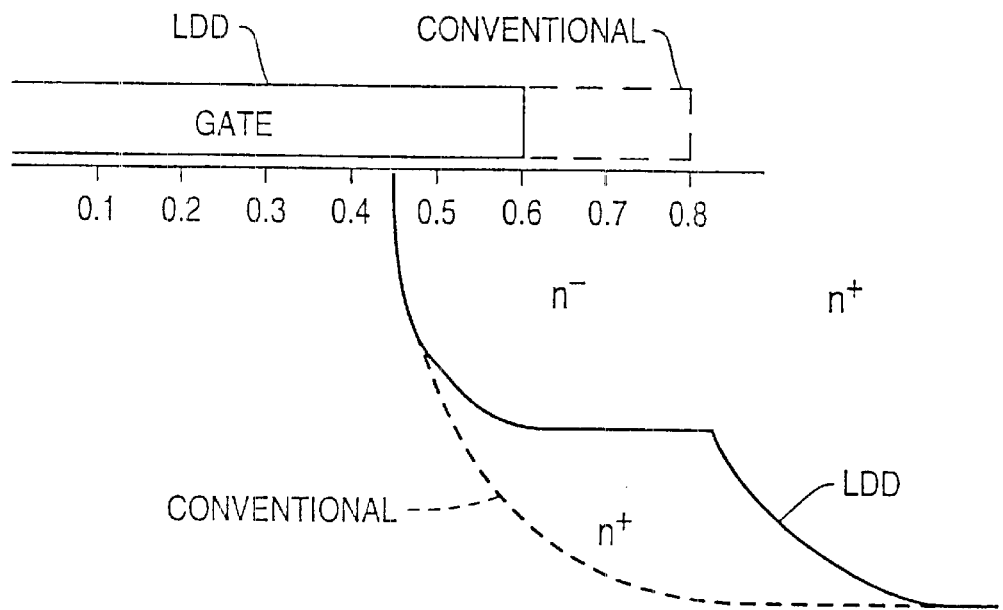
FIGS. 38 and 39 compares the electric fields between LDD and conventional drains.
Figure 39:
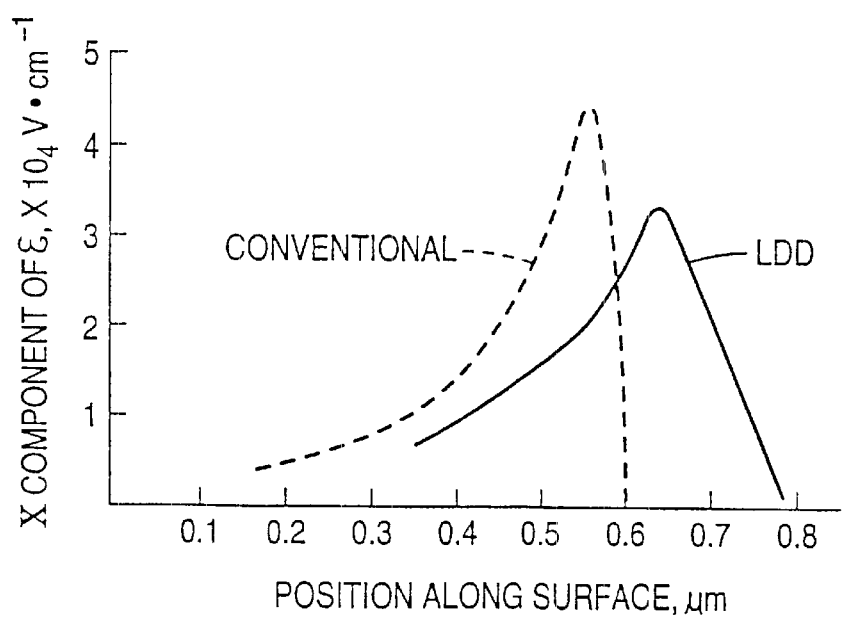
Figure 40:
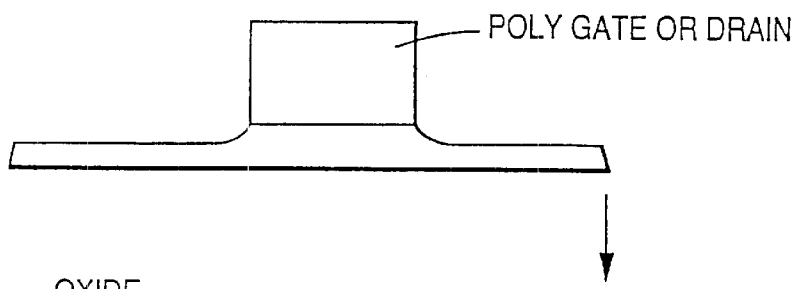
FIGS. 40–44 illustrates fabrication of oxide sidewalls.
Figure 41:
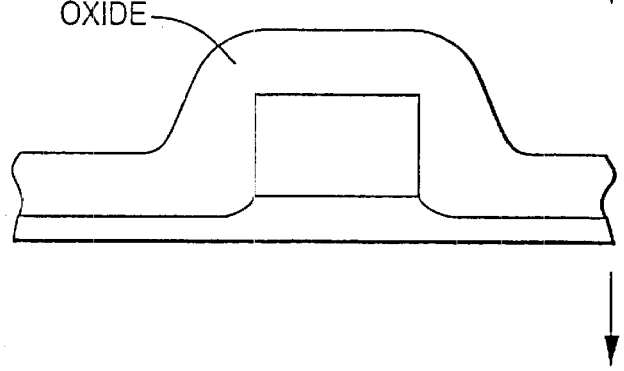
Figure 42:
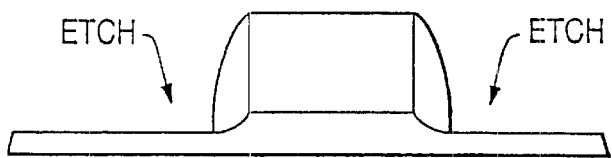
Figure 43:
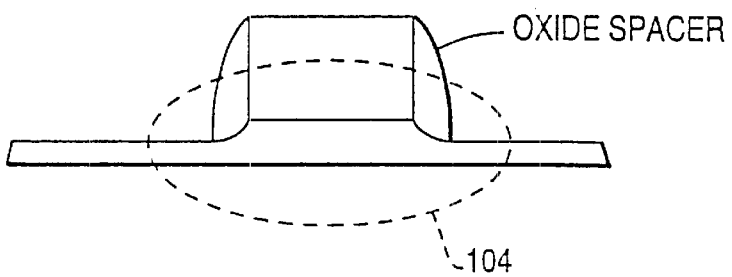
Figure 44:
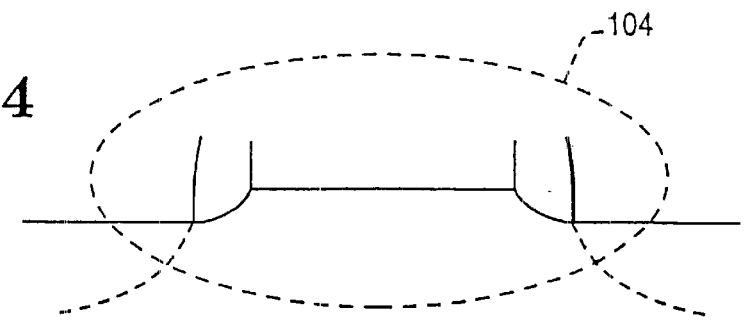

For the FETs, the LDD procedure reduces the electric field, as indicated in FIGS. 38–39. For the BJTs, the LDD procedure reduces the base resistance-(Rb), as well as causing some of the electric field reduction shown in FIGS. 38–39.

The Inventor points out that the LDD procedure for the P-channel FET is done simultaneously with the LDD procedure for the BJT base. (The term "LDD," when applied to the BJT base, is technically a misnomer: there is no "drain" in the BJT. However, insofar as the term "LDD" refers to the structure shown in FIG. 36, the term accurately describes the structure formed at the base of the BJT.)

FIGS. 40–44

Figure 23:
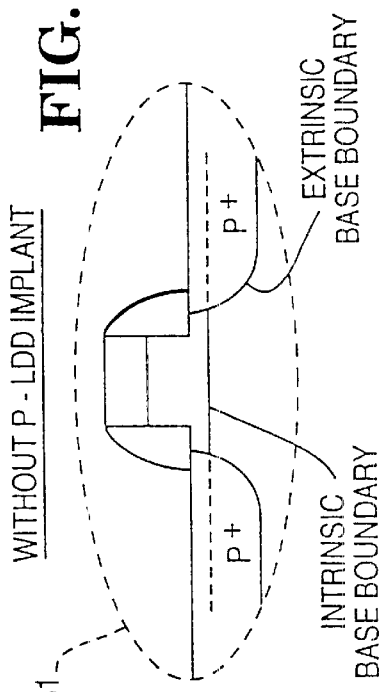
Figure 24:
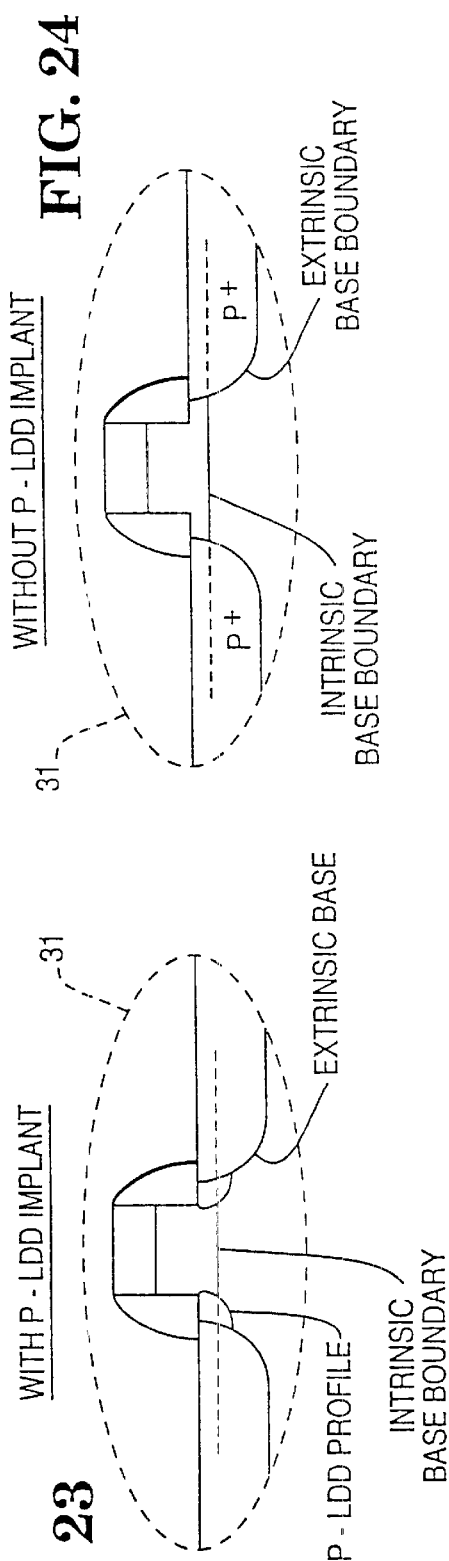
Figure 26:
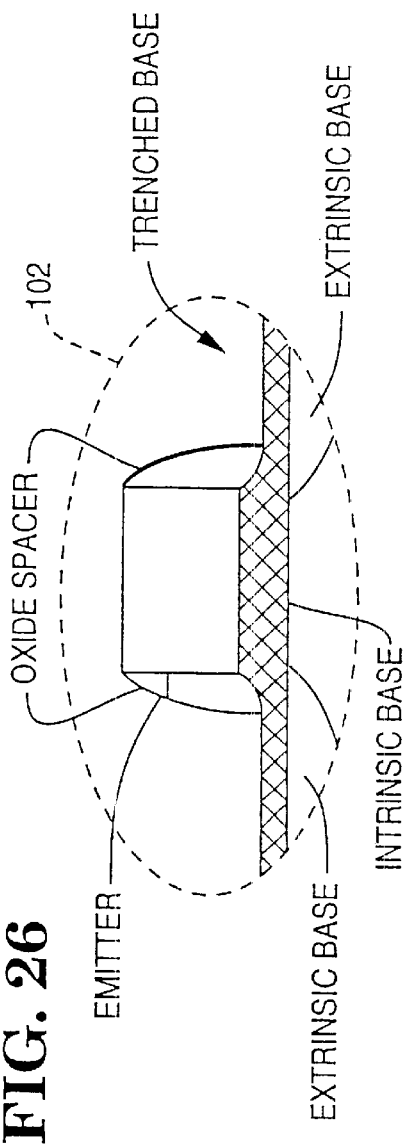

Afterward, in another processing sequence, oxide spacers, shown in FIG. 26 and in FIGS. 23–24, are formed having a width from 500 to 4,000 Angstroms.

The fabrication sequence is indicated in FIGS. 40–44. An oxide film is grown, as indicated. Then, without masking, an anisotropic etch is undertaken, which removes part of the film, as indicated, leaving the oxide spacers, which are also called sidewalls or shoulders.

The added sidewall assists in inhibiting the base-emitter contacting shown in FIG. 32. In a strict sense, the sidewall is not necessary for the emitter; trenching, by itself, will prevent the contacting.

Figure 25:
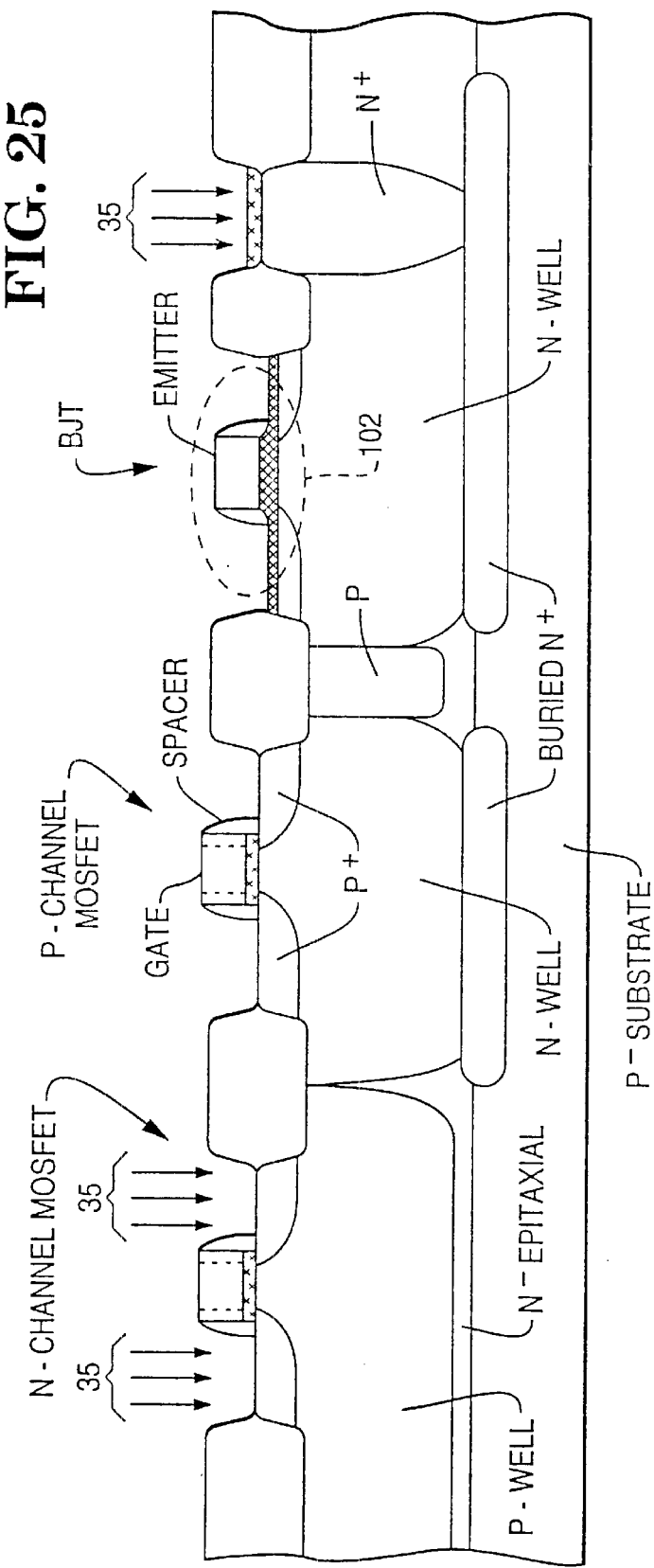

The Inventor points out that sidewall spacers are formed on both (a) the polysilicon gates of both types of FET and (b) the emitter of the BJT, as shown in FIG. 25. Further, all spacers are formed during the same processing steps.

Figure 22:
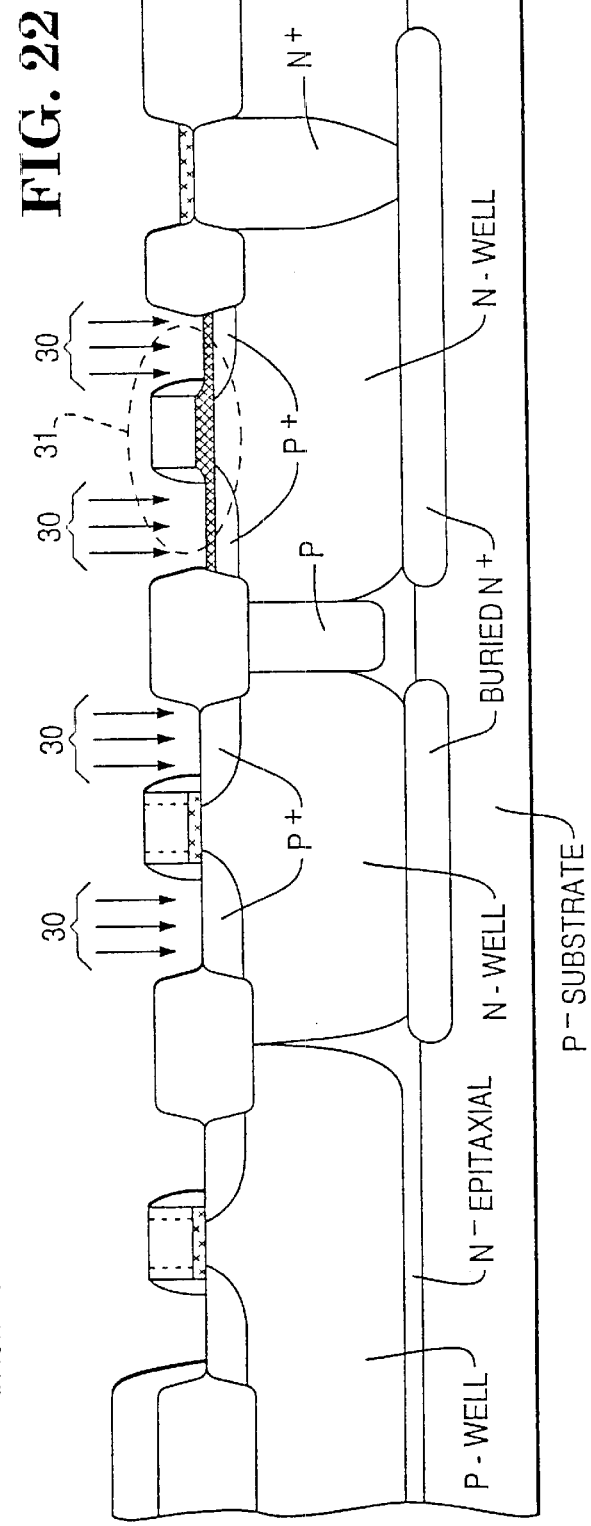

FIG. 22—S/D and Base Doping

The regions bordering the spacer oxide are doped $P^+$, as indicated by arrows 30. These P+ ion implantation regions form the extrinsic part of the base of the NPN bipolar transistor, as labeled in the insert 31 in FIG. 22. The intrinsic part of the base is also labeled.

The terms "extrinsic" and "intrinsic," in this context, do not refer to whether a semiconductor is (a) pure and undoped (ie, "intrinsic") or (b) doped (ie, "extrinsic"). Rather, the terms in FIG. 22 refer to the physical locations of the base regions: The intrinsic base is the "business" part of the base in the transistor, where carrier injection occurs. The extrinsic base is the external part of the base, to which contacts are attached.

This $P^+$ ion implantation also forms sources and drains (hence the term "S/D doping") in the FET-N-wells, as indicated by arrows 30.

FIGS. 25–26—S/D, Emitter, and Collector Doping

In a second implantation, indicated by arrows 35 in FIG. 25 (which may precede the first chronologically), a heavy dose N+ implant is performed to construct the source and drain of the FET-P-well. Also, in the same N+ implantation, the EMITTER and COLLECTOR of the BJT are made $N^+$.

(Appropriate masking steps are taken between implants 30 and 35. Masking is not shown.)

Figure 27:
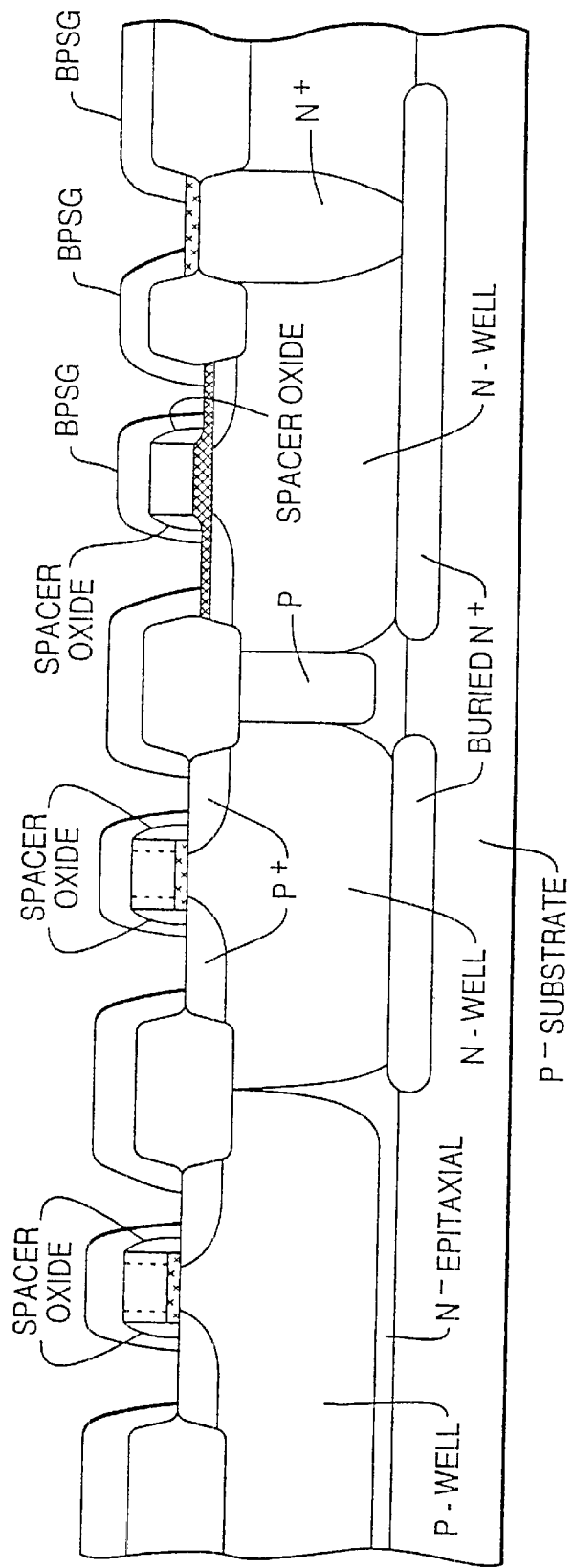
Figure 28:
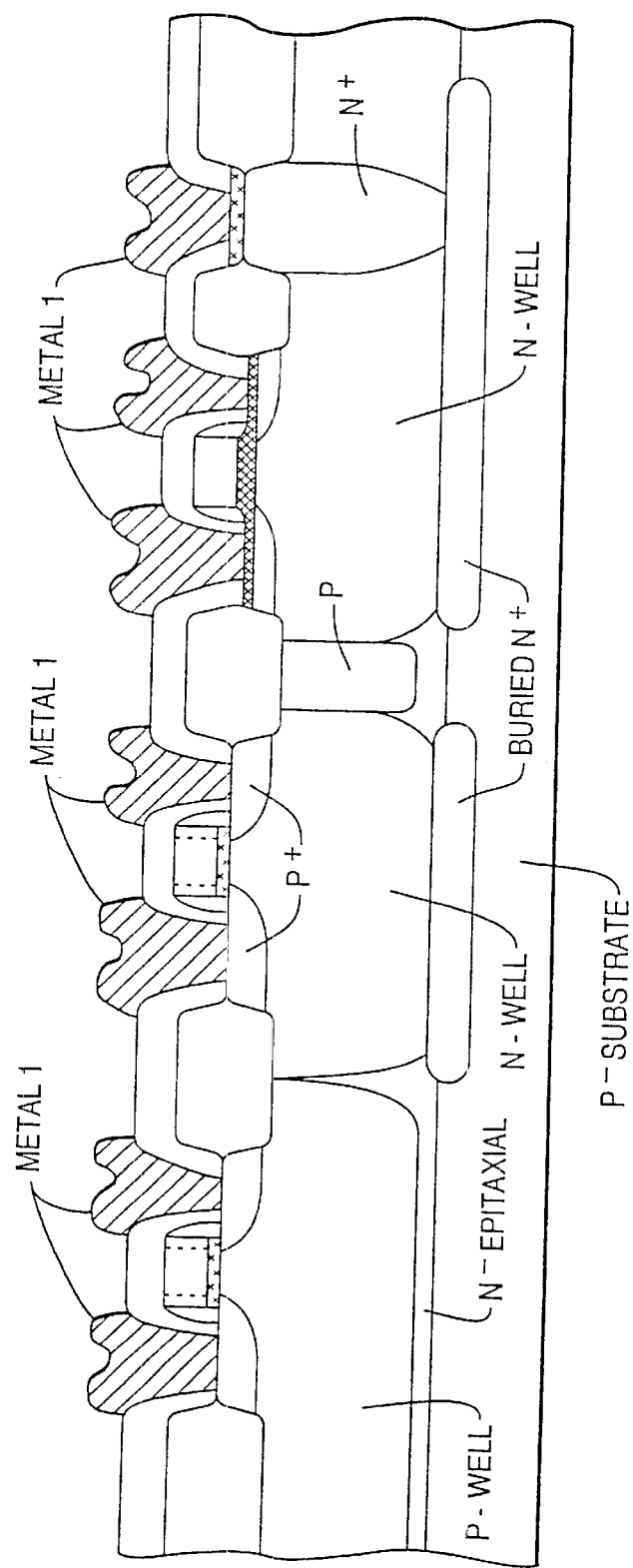

FIGS. 27 and 28—BPSG and Metallization

After the source-drain implant, Boro-polysilicate glass (BPSG) is applied, and etched, to form the structure indicated in FIG. 27. Then, METAL 1 contacts are applied, as indicated in FIG. 28. From the structure shown in FIG. 28, known steps, such as forming vias, additional metallization, and passivation, are undertaken, to produce the interconnect and the finished integrated circuit.

Additional Considerations

1. Number of Heat Treatments. The fabrication sequence involves exposing the wafer to the following heat treatments:

| | Treatment | Temperature | Time |
|---|---|---|---|
| 1. | Wafer Anneal | 1,000–1150 | 30 min.–3 hours |
| 2. | EPI growth | 1,000–1150 | 1–10 minutes |
| 3. | Well Drive | 950–1100 | 10 min.–4 hours |
| 4. | Field oxidation (WET) | 850–950 | 1–12 hours |
| 5. | S/D anneal | | |
| | (first approach) | ramp 550 to 950 | 5 min–3 hours |
| | (second approach) | 950–1100 (RTP) | 5 sec.–1 minute |
| 6. | BPSG | 600–800 | 20 min.–2 hrs. |

Notes

Temperatures are degrees Centigrade.

re 1: Wafer anneal refers to annealing of the initial, bare silicon wafer.

re 2: EPI growth refers to growth of the epitaxial silicon, shown in FIG. 1.

re 3: Well drive refers to the drive-in steps shown in FIG. and 3.

re 4: Field oxidation (referring to the oxide 3 in FIG. 2) is wet, because done in the presence of steam.

re 5: There are two (or more) ways to perform the source/drain (S/D) anneal. One is the ramping to 950 degrees, followed by holding the wafer at 950 degrees for the time specified. The other is Rapid Thermal Processing (RTP), which is known in the art.

re 6: BPSG refers to Boron-Phospho-Silicate Glass formation.

A ramp-up in temperature is used in many steps, primarily to avoid subjecting the wafer to thermal shock, which can crack the wafer, or induce irregularities in the crystal structure, such as slip planes.

A typical ramp-up is from 350 degrees C. to the stated temperature, at the rate of about 10 or 12 degrees per minute.

Ramp-down is done for the same reason, at the rate of about 3 to 6 degrees per minute.

One suitable RTP sequence is a ramp-up of 25–150 degrees C./sec., and a ramp-down of 10–50 degrees C./sec.

The Inventor points out that these heat treatment steps total six in number. The wafer is subjected to a heating event only six times, yet both BJTs and FETs are fabricated on the same wafer. This is a saving over the serial addition of BJT fabrication steps to FET fabrication steps.

For example, BJT wells are formed in the same processing steps as FET wells, as shown in FIG. 3.

As another example, the COLLECTOR PLUG shown in FIG. 3 is formed at the same time as the FET wells and BJT wells.

The RTP may not constitute a heating event, because its duration is so short.

2. Reduced Number of Masking Steps. The invention reduces the number of masking steps required. A "masking step" consists of numerous individual procedures, such as a) cleaning;

b) photoresist application;

c) preliminary photoresist curing (or "soft baking");

d) exposure of the photoresist (as by a stepper camera);

e) developing the photoresist;

f) final photoresist curing (or "hard baking");

g) etching, to remove material not protected by the photoresist left in place;

h) stripping the photoresist; and i) cleaning.

Of course, some masking steps may change the procedures, or materials used. For example, in field oxide growth, shown in FIG. 2, a high-temperature mask, such as silicon nitride, is used instead of photoresist, because the field oxide growth is a high temperature process, which would destroy ordinary photoresist. As another example, light-sensitive photoresist is not necessary; electron-beam photoresists are available.

One definition of "masking step," is: a series of procedures which include (A) creating a pattern (such as a photoresist pattern) and (B) using the pattern to protect the surface from ambient agents.

As to (B), different types of protection occur. Examples are the following:

A photoresist pattern protects underlying material from being etched by reactive species applied to the wafer.

A photoresist pattern absorbs incoming atoms during implantation, thereby preventing implantation into the surface beneath.

Silicon nitride prevents oxidation of the silicon beneath it (except at edges, where "bird's beaks" form).

An oxide pattern is used to block implantation.

Another definition of masking is the use of a pattern, which covers some areas and leaves other areas exposed, to block modification of the surface at the covered areas, and allow modification of the surface at the exposed areas.

The invention reduces the number of masking steps required. The steps are:

a) The masking step for defining buried layers in FIG. 1. The buried layers in the FET-wells are used for latch-up prevention; the buried layers in the BJT-wells are used as part of the collector.

b) The masking step for field oxide definition. Field oxide is shown in FIG. 3. A silicon nitride pattern covers the areas where the devices are to be formed, and prevents oxidation there.

c) The masking step for N-well definition. An N-well is shown in FIG. 2. Photoresist blocks implantation of the N-type dopants into the P-wells: only the N-wells receive the N-type implant.

d) The masking step for P-well definition. A P-well is shown in FIG. 2. Photoresist blocks implantation of the P-type dopants into the N-wells: only the P-wells receive the P-type implant.

e) The masking step for BJT collector plug definition. FIG. 3 shows the plug. Photoresist blocks implantation everywhere except at the collectors of the BJTs.

f) The masking step used in BJT base implant. FIG. 7 shows the base implant. Again, photoresist blocks implantation everywhere except at the base.

g) The masking step which defines polysilicon emitters for BJTs and polysilicon gates for FETs. FIG. 16 shows these structures.

h) The masking step used during etching of the trench in the BJT base. The trenched base is shown in FIGS. 16–17.

i) The masking step involved in forming Lightly Doped Drains. FIG. 36 shows LDDs.

j) The masking step used in defining P-implant regions, which regions include FET drains, FET sources, and BJT bases. Implants 30 in FIG. 15 show these implants.

k) The masking step used in defining N-implant regions, which include FET sources and FET drains. Implants 35 in FIG. 25 show these implants.

l) The masking steps used in forming contacts, vias, interconnects, and in opening pad areas for wire bonding. These steps form (a) the interconnections between the devices and (b) the connections to the outside world. The number of masking steps involved depends upon the complexity of the interconnections, and the number of layers of interconnections. The number of masking steps depends on the design of the particular integrated circuit in question. The invention is not concerned with these.

3. Particular Combination of Unique Devices. The invention comprises the following devices on a single integrated circuit. FIG. 25 shows: N-channel MOSFETs, P-channel MOSFETs, and a BJT having a trenched base. The trenched base prevents the problem shown in FIGS. 18–19 and 29–35.

That is, the structure shown in FIG. 17 will be subjected to two subsequent heat treatments, namely, the source/drain anneal and the BPSG deposition. This heating will cause the diffusion shown in FIG. 30. This diffusion is undesirable, because it can cause the leakage currents discussed above. Trenching the base prevents this problem, as shown in FIG. 33. The trenching places a longer diffusion path between the extrinsic base and the junction.

The trenching creates a structure which is sometimes called a butte-mounted emitter. The butte has two levels: a top level T in FIG. 21, and a ground level G.

Figure 45:
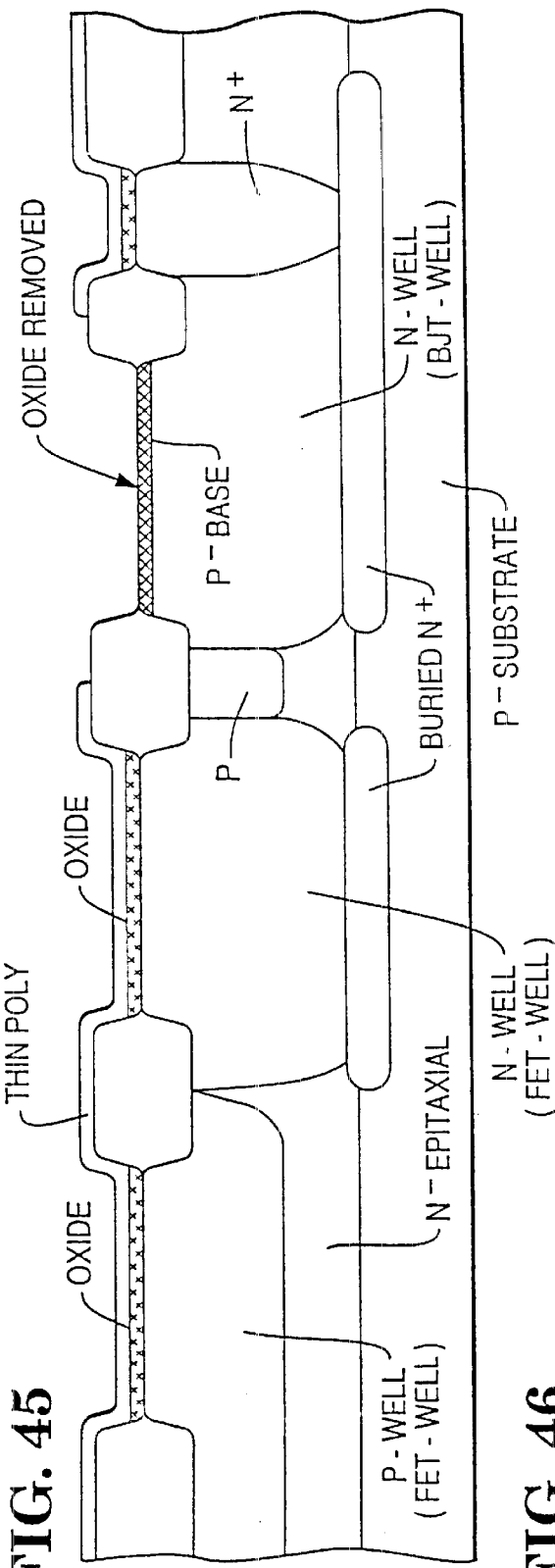
FIGS. 45 and 46 identify two intermediate structures used by the invention.

4. Unique Intermediate Structure. The invention uses the intermediate structure shown in FIG. 14, and in simpler form in FIG. 45. The oxide, which is later used as gate oxide beneath the polysilicon gates, coats the FET-wells. However, the oxide has been removed from the BJT-well, because the polysilicon emitter must make electrical contact with the P-type base. (Native oxide may reside on the BJT well. It becomes removed, as known in the art.)

Viewed another way, the structure of FIGS. 14 and 15 have the following features: polysilicon gates are insulated from FET-wells by oxide, but polysilicon emitters are in contact with BJT-wells. The polysilicon gates and polysilicon emitters were fabricated from a single layer of polysilicon.

Figure 46:
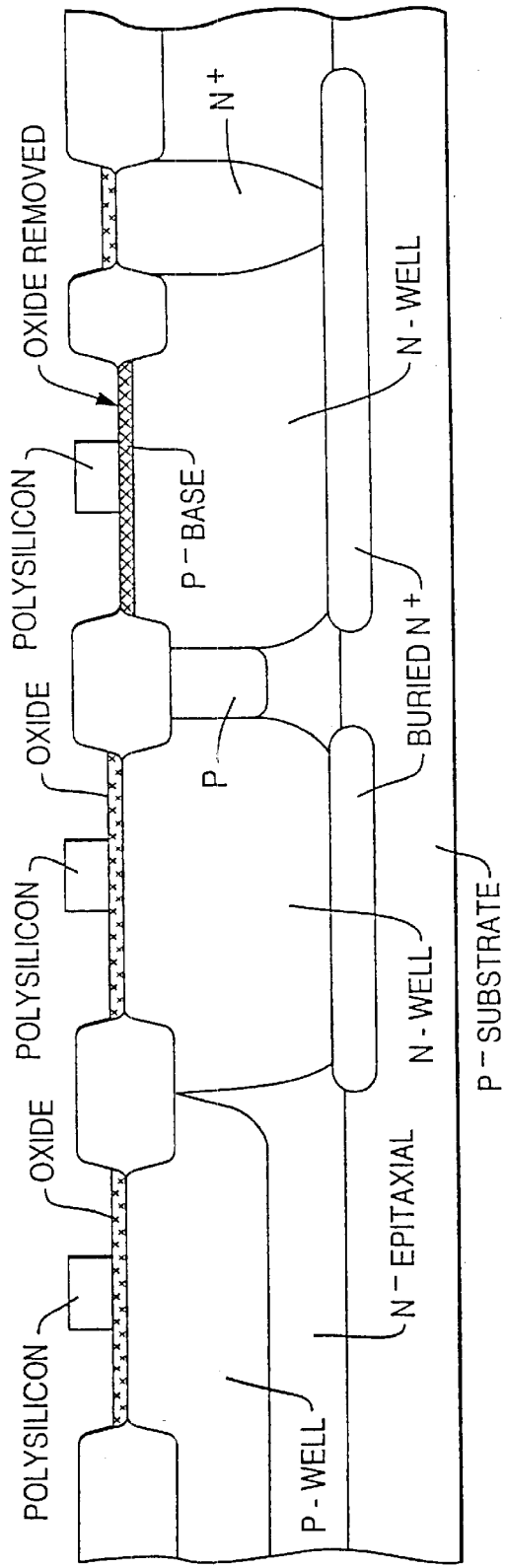

Another intermediate structure is shown in FIG. 46. Polysilicon gates are positioned on oxide which coats the FET-wells. A polysilicon emitter is positioned on a P⁻ base, with no oxide between the emitter and the base. The trenching has not yet been done.

Numerous substitutions and modifications can be undertaken without departing from the true spirit and scope of the invention. What is desired to be secured by Letters Patent is the Invention as defined in the following claims.

What is claimed is:

1. In fabrication of a BICMOS integrated circuit, the improvement comprising:

a) interrupting drive-in diffusion of any of N-type and P-type wells prior to contact of at least one of said wells with a buried layer;

b) implanting dopant into at least one of the wells;

c) completing the drive-in diffusion of the wells, such that the implanted dopant forms a collector plug for later use as a collector of a BJT.

2. In fabrication of a BICMOS integrated circuit on a wafer, the improvement comprising:

a) performing an N-well and P-well drive-in diffusion step by heating the wafer to at least 950 degrees C. for a period of 10 minutes to 4 hours to drive N-well dopants which are not in contact with a buried layer to be in contact with a buried layer; and b) diffusing a collector plug during said period.

3. In fabrication of an integrated circuit on a silicon wafer, the improvement comprising:
   a) forming BJTs and CMOS devices on the wafer; and
   b) subjecting the wafer to no more than 5 high temperature events during said forming.

4. In fabrication of an integrated circuit on a silicon wafer, the improvement comprising:
   a) forming BJTs and CMOS devices on the wafer; and
   b) subjecting the wafer to no more than 4 high temperature events, plus no more than one RTP event, during said forming.

5. In fabrication of a BICMOS integrated circuit on a silicon wafer, the improvement comprising the following steps:
   a) fabricating an intermediate structure which includes
      i) a P-well having
         A) an oxidized surface and
         B) a first polysilicon gate on the oxidized surface;
      ii) a first N-well having
         A) an oxidized surface and
         B) a second polysilicon gate on the oxidized surface;
      iii) a second N-well having
         A) a P-doped surface
         B) a P-doped butte on the surface
         C) a polysilicon emitter on the butte;
   b) forming oxide shoulders on the polysilicon gates and the polysilicon emitter;
   c) during a single implant after said forming oxide shoulders step, forming
      i) a P-type source and a P-type drain adjacent the second polysilicon gate and
      ii) an extrinsic P-type base adjacent the butte; and
   d) implanting an N-source and an N-drain adjacent the first polysilicon gate.

6. In the fabrication of a BICMOS integrated circuit, the improvement comprising using the following masking steps and no others:
   a) a masking step for defining buried layers used for latch-up prevention;
   b) a masking step for field oxide definition;
   c) a masking step for N-well definition;
   d) a masking step for P-well definition;
   e) a masking step for BJT collector plug definition;
   f) a masking step used in BJT base implant;
   g) a masking step for defining polysilicon emitters for BJTs and polysilicon gates for FETs;
   h) a masking step used during etching of a trench in the BJT base;
   i) a masking step involved in forming Lightly Doped Drains;
   j) a masking step for defining P-implant regions, which regions include FET drains, FET sources, and BJT bases;
   k) a masking step for defining N-implant regions, which include FET sources and FET drains; and
   l) masking steps for forming contacts, vias, and interconnects.

* * * * *